US012796299B2

(12) United States Patent
Song et al.

(10) Patent No.: US 12,796,299 B2
(45) Date of Patent: Nov. 10, 2026

(54) DISPLAY DEVICE INCLUDING OPTICAL FILTER

(71) Applicant: SAMSUNG DISPLAY CO., LTD., Yongin-si (KR)

(72) Inventors: Bo Kwang Song, Yongin-si (KR); Gee Bum Kim, Yongin-si (KR); Kwang Soo Bae, Yongin-si (KR); Dae Young Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 538 days.

(21) Appl. No.: 18/100,082

(22) Filed: Jan. 23, 2023

(65) Prior Publication Data

US 2023/0329073 A1 Oct. 12, 2023

(30) Foreign Application Priority Data

Apr. 11, 2022 (KR) ........................ 10-2022-0044396

(51) Int. Cl.

| | |
|---|---|
| ***H10K 59/80*** | (2023.01) |
| ***G06V 40/13*** | (2022.01) |
| ***H10K 39/34*** | (2023.01) |
| ***H10K 59/35*** | (2023.01) |
| *H10K 59/12* | (2023.01) |

(52) U.S. Cl.

CPC ..... *H10K 59/8792* (2023.02); *G06V 40/1318* (2022.01); *H10K 39/34* (2023.02); *H10K 59/351* (2023.02); *H10K 59/873* (2023.02); *H10K 59/12* (2023.02); *H10K 59/1201* (2023.02); *H10K 59/353* (2023.02)

(58) Field of Classification Search

CPC .... H10K 59/873; H10K 59/351; H10K 39/34; H10K 59/8792; G06V 40/1318; G06V 40/12

See application file for complete search history.

(56) References Cited

U.S. PATENT DOCUMENTS

| | | | | |
|---|---|---|---|---|
| 11,450,655 | B2 | 9/2022 | You et al. | |
| 11,543,919 | B2 | 1/2023 | Han et al. | |
| 11,899,862 | B2 | 2/2024 | Bok et al. | |
| 2018/0074365 | A1* | 3/2018 | Lee .................. | G02F 1/133621 |

(Continued)

FOREIGN PATENT DOCUMENTS

| | | |
|---|---|---|
| KR | 10-2020-0000012 | 1/2020 |
| KR | 10-2020-0036255 A | 4/2020 |

(Continued)

OTHER PUBLICATIONS

Office Action Dated Nov. 14, 2025 Issued in Corresponding Korean Application No. 10-2022-0044396.

(Continued)

*Primary Examiner* — Suberr L Chi

(74) *Attorney, Agent, or Firm* — F. CHAU & ASSOCIATES, LLC

(57) ABSTRACT

A display device includes: a substrate; a light emitting element disposed on the substrate and configured to emit light; a photoelectric conversion element disposed on the substrate and configured to sense incident light; a light blocking layer disposed on the photoelectric conversion element and having an opening; and an optical filter disposed in the opening of the light blocking layer to transmit incident light.

20 Claims, 27 Drawing Sheets

(56) References Cited

U.S. PATENT DOCUMENTS

| | | | | |
|---|---|---|---|---|
| 2019/0371866 | A1* | 12/2019 | Kim | H10K 59/879 |
| 2021/0280569 | A1* | 9/2021 | You | H01L 25/18 |
| 2023/0093839 | A1* | 3/2023 | Gao | G02B 3/0012 |
| 2024/0184390 | A1 | 6/2024 | Bok et al. | |

FOREIGN PATENT DOCUMENTS

| | | | |
|---|---|---|---|
| KR | 10-2021-0082316 | A | 7/2021 |
| KR | 10-2021-0086907 | | 7/2021 |
| KR | 10-2021-0105361 | | 8/2021 |
| KR | 10-2021-0113525 | A | 9/2021 |
| KR | 10-2022-0030004 | A | 3/2022 |
| WO | 2020-165686 | | 8/2020 |

OTHER PUBLICATIONS

Office Action Issued in Corresponding Korean Application No. KR 10-2022-0044396 on Sep. 21, 2026.

* cited by examiner

DISPLAY DEVICE INCLUDING OPTICAL FILTER

CROSS-REFERENCE TO RELATED APPLICATION

This application claims priority under 35 U.S.C. § 119 to Korean Patent Application No. 10-2022-0044396 filed on Apr. 11, 2022 in the Korean Intellectual Property Office, the disclosure of which is incorporated by reference herein in its entirety.

TECHNICAL FIELD

The present invention relates to a display device.

DISCUSSION OF THE RELATED ART

As the information society continues to develop, the demand for a display device in various forms for displaying an image increases. For example, the display device is applied to various electronic devices such as a smart phone, a digital camera, a notebook computer, a navigation system, a smart watch, and a smart television. The display device may be a flat panel display device such as a liquid crystal display device, a field emission display device, or an organic light emitting display device.

Recently, a technology for integrating sensors for touch recognition or fingerprint recognition into the display device is under development. To increase an accuracy of fingerprint recognition, a region of light incident on a light sensing unit (hereinafter, "fingerprint sensing region") should be relatively narrow. The fingerprint sensing region may be set by the light sensing unit and an opening of a light blocking layer disposed on the light sensing unit. A narrowing of the fingerprint sensing region is under development.

SUMMARY

Aspects of the present invention provide a display device having a fingerprint sensing region smaller than an area of a region formed by a light sensing unit and an opening of a light blocking layer disposed on the light sensing unit.

According to an embodiment of the present invention, a display device includes: a substrate; a light emitting element disposed on the substrate and configured to emit light; a photoelectric conversion element disposed on the substrate and configured to sense incident light; a light blocking layer disposed on the photoelectric conversion element and having an opening; and an optical filter disposed in the opening of the light blocking layer to transmit incident light.

In an embodiment of the present invention, the optical filter includes a low refractive layer and a high refractive layer having a higher refractive index than that of the low refractive layer.

In an embodiment of the present invention, the low refractive layer and the high refractive layer are provided in plurality, respectively, and the high refractive layers and the low refractive layers are alternately disposed on each other in a thickness direction of the substrate.

In an embodiment of the present invention, the display device further includes a window disposed on the optical filter, wherein a refractive index of the window is lower than the refractive index of the high refractive layer.

In an embodiment of the present invention, the optical filter includes at least one $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, VOX, SiNX, eNX, AlN, ZnS, CdS, SiC, SiCN, MgF, $CaF_2$, NaF, $BaF_2$, $PbF_2$, LiF, $LaF_3$, GaP, or AlOx.

In an embodiment of the present invention, the photoelectric conversion element is configured to sense light of a green wavelength band, and the optical filter is configured to transmit the light of the green wavelength band.

In an embodiment of the present invention, the optical filter is configured to reflect light of a red wavelength band.

In an embodiment of the present invention, the display device further includes a color filter disposed on the optical filter and the light blocking layer.

In an embodiment of the present invention, the color filter is configured to transmit light of a green wavelength band.

In an embodiment of the present invention, the opening of the light blocking layer overlaps the photoelectric conversion element in a thickness direction of the substrate, and a width of the opening of the light blocking layer in one direction is smaller than a width of the photoelectric conversion element in the one direction.

In an embodiment of the present invention, a thickness of the optical filter is greater than a thickness of the light blocking layer.

In an embodiment of the present invention, a thickness of the optical filter is smaller than a thickness of the light blocking layer.

In an embodiment of the present invention, the optical filter includes: an inner side surface inclined in a direction toward the photoelectric conversion element, and an outer side surface inclined in a direction away from the photoelectric conversion element.

In an embodiment of the present invention, the light blocking layer includes a side surface inclined in the direction toward the photoelectric conversion element, and a sum of an inclination angle of the inner side surface of the optical filter and an inclination angle of the side surface of the light blocking layer is 180°.

In an embodiment of the present invention, an inclination angle of the inner side surface of the optical filter with respect to an upper surface of the substrate is different from an inclination angle of the outer side surface of the optical filter with respect to an upper surface of the substrate.

In an embodiment of the present invention, the inner side surface and the outer side surface of the optical filter protrude beyond an upper surface of the light blocking layer.

According to an embodiment of the present invention, A display device includes: a substrate; a light emitting element disposed on the substrate and configured to emit light; a photoelectric conversion element disposed on the substrate and configured to sense incident light; an encapsulation layer disposed on the light emitting element and the photoelectric conversion element, a light blocking layer disposed on the encapsulation layer and including an opening; and an optical filter overlapping the photoelectric conversion element in a thickness direction of the substrate and having a multilayer film.

In an embodiment of the present invention, the light blocking layer is in contact with a side surface of the optical filter.

In an embodiment of the present invention, the light blocking layer includes a first bottom surface and second bottom surface, wherein the first bottom surface is disposed on the encapsulation layer, and the second bottom surface is disposed on the optical filter, and a distance between the photoelectric conversion element and the first bottom surface is shorter than a distance between the photoelectric conversion element and the second bottom surface.

In an embodiment of the present invention, a width of the opening in one direction is smaller than a width of the optical filter in the one direction.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF THE EMBODIMENTS

Figure 1:
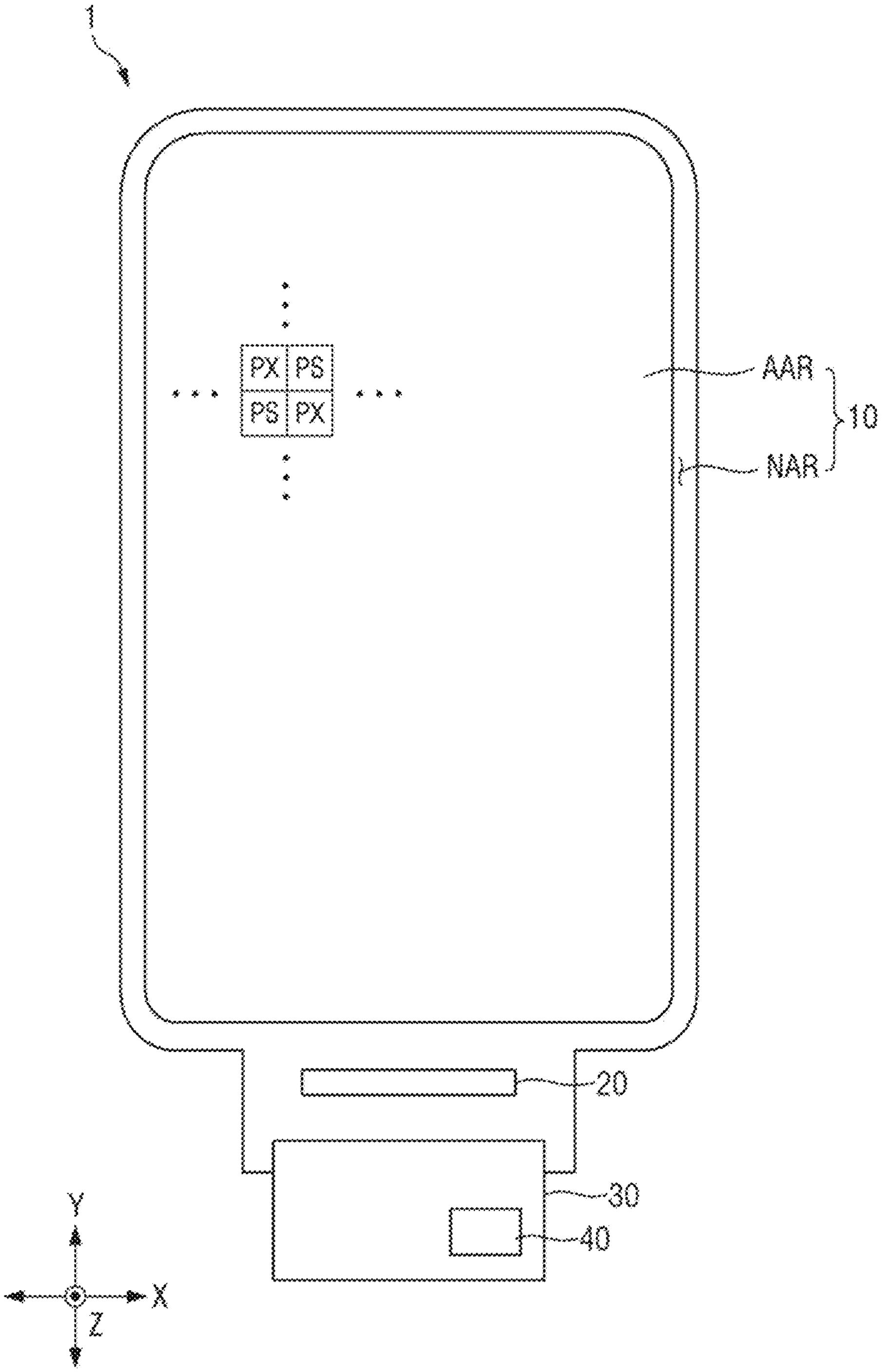
FIG. 1 is a plan view of a display device according to an embodiment of the present invention.

Embodiments of the present invention will now be described more fully hereinafter with reference to the accompanying drawings, in which embodiments of the present invention are shown. The present invention may, however, be embodied in different forms and should not be construed as being limited to the embodiments set forth herein. It is to be understood that the same reference numbers indicate the same components throughout the specification, and thus, repetitive descriptions may be omitted. In the drawings, various thicknesses, lengths, and angles are shown and while the arrangement shown does indeed represent an embodiment of the present invention, it is to be understood that modifications of the various thicknesses, lengths, and angles may be possible within the spirit and scope of the present invention and the present invention is not necessarily limited to the particular thicknesses, lengths, and angles shown.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. For example, "a first element," "component," "region," "layer" or "section" discussed below could be termed a second element, component, region, layer or section without departing from the spirit and scope of the present invention.

It will also be understood that when a layer is referred to as being "on" another layer or substrate, it can be directly on the other layer or substrate, or intervening layers may also be present. In contrast, when an element is referred to as being "directly on" another element, there are no intervening elements present.

As used herein, the singular forms "a," "an," and "the" are intended to include the plural forms, including "at least one," unless the context clearly indicates otherwise. "Or" means "and/or." "At least one of A and B" means "A and/or B." As used herein, the term "and/or" includes any and all combinations of one or more of the associated listed items.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Hereinafter, embodiments of the present invention will be described with reference to the accompanying drawings.

FIG. 1 is a plan view of a display device according to an embodiment of the present invention.

In FIG. 1, a first direction X, a second direction Y, and a third direction Z are indicated. The first direction X may be a direction parallel to one side of a display device 1 when viewed on a plane, for example, a horizontal direction of the display device 1. The second direction Y may be a direction parallel to the other side in contact with one side of the display device 1 when viewed on a plane, and may be a vertical direction of the display device 1. Hereinafter, for convenience of explanation, one side in the first direction X refers to a right direction in plan view and the other side in the first direction X refers to a left direction in plan view, and one side in the second direction Y refers to an upward direction in plan view and the other side in the second direction Y refers to a downward direction in plan view. The third direction Z may be a thickness direction of the display device 1 and may be substantially perpendicular to a surface of the display device. However, it should be understood that the directions mentioned in the embodiments of the present invention refer to relative directions, and the embodiments of the present invention are not limited to the mentioned directions.

Unless otherwise defined, in the present specification, "upper side" and "upper surface" expressed with respect to the third direction Z refer to a display surface with respect to a display panel 10, and "lower side", "lower surface", and "rear surface" expressed with respect to the third direction Z refer to an opposite side of the display surface with respect to the display panel 10.

Referring to FIG. 1, the display device 1 may include various electronic devices that provide a display screen. Examples of the display device 1 may include, but are not limited to, mobile phones, smartphones, tablet personal computers (PCs), mobile communication terminals, electronic notebooks, e-books, personal digital assistants (PDAs), portable multimedia players (PMPs), navigation, ultra mobile PCs (UMPCs), televisions, game machines, wrist watch-type electronic devices, head-mounted displays, monitors of personal computers, laptop computers, vehicle instrument boards, digital cameras, camcorders, external billboards, electric signs, various medical devices, various inspection devices, various home appliances including a display region such as refrigerators and washing machines, or Internet of Things (IoT) devices. Representative examples of the display device 1 to be described later may include, but are not limited to, a smart phone, a tablet PC, or a laptop computer.

The display device 1 may include a display panel 10, a panel driving circuit 20, a circuit board 30, and a readout circuit 40.

The display panel 10 may include an active region AAR and a non-active region NAR.

The active region AAR includes a display region on which an image may be displayed. The active region AAR may overlap the display region. For example, the active region AAR may completely overlap the display region. A plurality of pixels PX displaying an image may be disposed in the display region. Each pixel PX may include a light emitting element ('EL' in FIG. 3).

The active region AAR further includes a light sensing region. The light sensing region is a region that responds to light, and is a region configured to sense the amount or wavelength of incident light. The light sensing region may overlap the display region. In an embodiment of the present invention, the light sensing region may overlap the active region AAR in plan view. For example, the light sensing region may completely overlap the active region AAR. In this case, the light sensing region and the display region may be the same. In an embodiment of the present invention, the light sensing region may be disposed only in a portion of the active region AAR. For example, the light sensing region may be disposed only in a limited region for fingerprint recognition. In this case, the light sensing region may overlap a portion of the display region, but might not overlap another portion of the display region.

A plurality of optical sensors PS that respond to light may be disposed in the light sensing region. Each optical sensor PS may include a photoelectric conversion element ("PD" in FIG. 3) that senses incident light.

The non-active region NAR may be disposed around and/or adjacent to the active region AAR. The panel driving circuit 20 may be disposed in the non-active region NAR. The panel driving circuit 20 may drive a plurality of pixels PX and/or a plurality of optical sensors PS. The panel driving circuit 20 may output signals and voltages for driving the display panel 10. The panel driving circuit 20 may be formed as an integrated circuit (IC) and mounted on the display panel 10. Signal lines for transmitting signals between the panel driving circuit 20 and the active region AAR may be disposed in the non-active region NAR. As an example, the panel driving circuit 20 may be mounted on the circuit board 30.

The circuit board 30 may be attached to one end of the display panel 10 using an anisotropic conductive film (ACF). Lead lines of the circuit board 30 may be electrically connected to a pad portion of the display panel 10. The circuit board 30 may be a flexible film such as a flexible printed circuit board or a chip on film.

The readout circuit 40 may be mounted on the circuit board 30. The readout circuit 40 may receive a photo current generated from the plurality of optical sensors PS of the display panel 10 to detect a user's fingerprint input.

Figure 2:
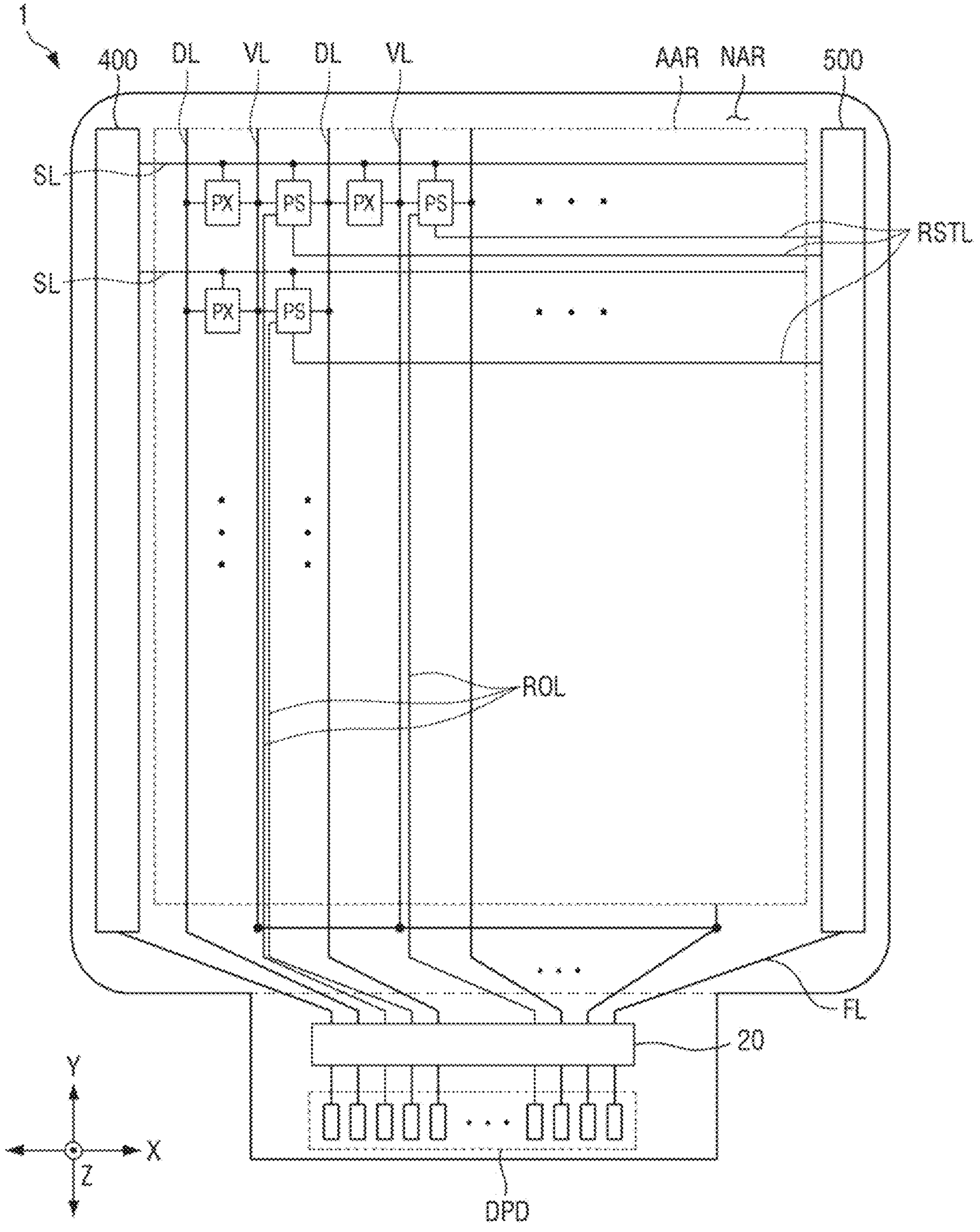
FIG. 2 is a schematic plan view of a display panel according to an embodiment of the present invention.

FIG. 2 is a schematic plan view of a display panel according to an embodiment of the present invention.

Referring to FIG. 2, scan lines SL, power voltage lines VL, data lines DL, reset signal lines RSTL and readout lines ROL may be disposed in the active region AAR. The scan lines SL and the power voltage lines VL may be connected to the plurality of pixels PX and the plurality of optical sensors PS. The data lines DL may be connected to the plurality of pixels PX, and the reset signal lines RSTL and readout lines ROL may be connected to the plurality of optical sensors PS.

The scan lines SL may supply scan signals received from a scan driving unit 400 to the plurality of pixels PX and the plurality of optical sensors PS. The data lines DL may supply a data voltage received from the panel driving circuit 20 to the plurality of pixels PX.

The power voltage lines VL may supply power voltages received from the panel driving circuit 20 to the plurality of pixels PX and the plurality of optical sensors PS. Here, the power voltage includes a first power voltage ("ELVDD" in FIG. 3) and a second power voltage ("ELVSS" in FIG. 3). The first power voltage ELVDD may be a high potential voltage, and the second power voltage ELVSS may be a low potential voltage.

The reset signal lines RSTL may supply reset signals received from a reset signal generating unit 500 to the plurality of optical sensors PS. The readout lines ROL may supply a current generated by photo charges of the optical sensor PS to the readout circuit 40.

The non-active region NAR may include a scan driving unit (e.g., a scan driving circuit or a scan driver) 400, fan-out lines FL, a reset signal generating unit (e.g., a reset signal generating circuit or a reset signal generator) 500, a panel driving circuit 20, and a readout circuit 40.

The scan driving unit 400 may generate a plurality of scan signals based on a scan control signal, and may sequentially supply the plurality of scan signals to the plurality of scan lines SL according to a set order.

The fan-out lines FL may extend from the panel driving circuit 20 to the active region AAR. The fan-out lines FL may supply the data voltage received from the panel driving circuit 20 to a plurality of data lines DL. In addition, the fan-out lines FL may transmit the current received from the readout line ROL to the panel driving circuit 20.

The reset signal generating unit 500 may generate a plurality of reset signals based on a reset control signal, and may sequentially supply the reset signals to a plurality of reset signal lines RSTL according to a set order. The optical sensor PS connected to the reset signal line RSTL may receive the reset signal. The reset signal generating unit 500 may be omitted.

The panel driving circuit 20 may output signals and voltages to the fan-out lines FL to drive the display panel 10. The panel driving circuit 20 may supply a data voltage to the data line DL through the fan-out lines FL. The data voltage may be supplied to the plurality of pixels PX, and the plurality of pixels PX may emit light based on the data voltage.

The readout circuit 40 may measure the magnitude of the current of the optical sensor PS through the readout line ROL. The readout circuit 40 may generate fingerprint sensing data according to the magnitude of the current sensed by the optical sensor PS and transmit the fingerprint sensing data to a main processor.

The non-active region NAR may further include a display pad portion DPD. The display pad portion DPD may electrically connect a plurality of signal lines to the circuit board 30.

In the present embodiment of the present invention, when each scan line SL is simultaneously connected to the plurality of pixels PX and the plurality of optical sensors PS, the plurality of pixels PX and the plurality of optical sensors PS may be turned on/off based on the same scan signal. Accordingly, a shape of a fingerprint may be optically sensed during a period when the screen is displayed. However, the present invention is not limited thereto, and the type and arrangement of the signal lines may be variously modified.

Figure 3:
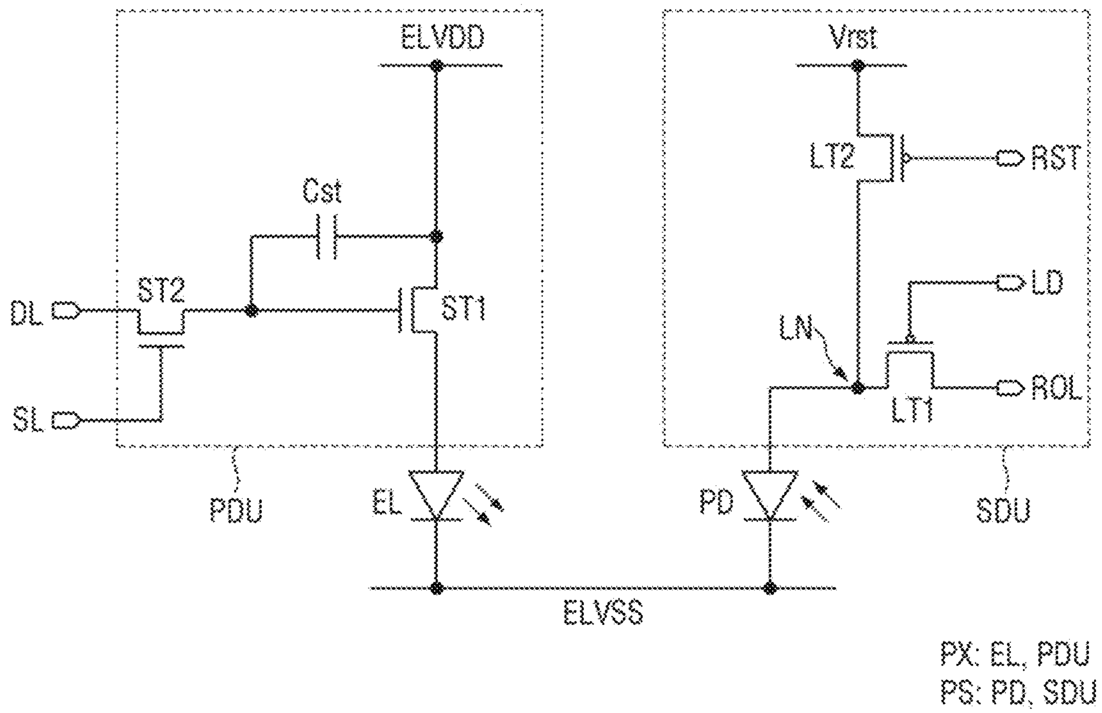
FIG. 3 is a circuit diagram of a pixel and an optical sensor according to an embodiment of the present invention.

FIG. 3 is a circuit diagram of a pixel and an optical sensor according to an embodiment of the present invention.

Referring to FIG. 3, the pixel PX may include a light emitting element EL and a pixel driving unit PDU controlling an amount of light emitted from the light emitting element EL. The pixel driving unit PDU may include a capacitor Cst, a first transistor ST1, and a second transistor ST2. The pixel driving unit PDU may receive the data signal through the data line DL connected thereto. In addition, the pixel driving unit PDU may receive the scan signal through the scan line SL connected thereto. Further, the first power voltage ELVDD and the second power voltage ELVSS may be applied to the pixel driving unit PDU.

The light emitting element EL may be an organic light emitting diode including an organic light emitting layer disposed between an anode electrode and a cathode electrode. In addition, the light emitting element EL may be a quantum dot light emitting element including a quantum dot light emitting layer disposed between the anode electrode and the cathode electrode. In addition, the light emitting element EL may be an inorganic light emitting element including an inorganic semiconductor disposed between the anode electrode and the cathode electrode. When the light emitting element EL is the inorganic light emitting element, the light emitting element EL may include a micro light emitting diode or a nano light emitting diode.

Figure 8:
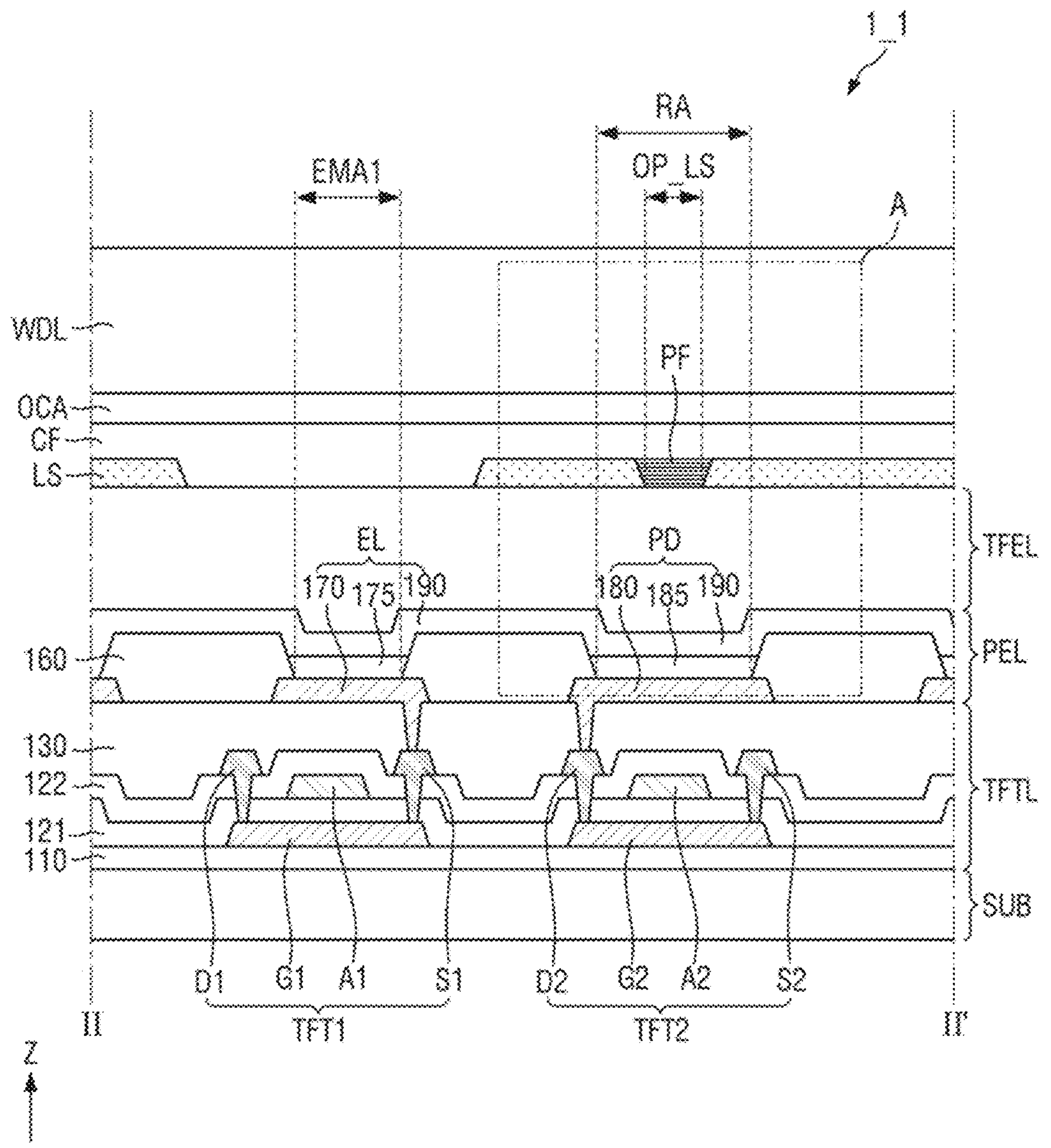
FIG. 8 is a cross-sectional view illustrating an example of the display device taken along II-II' of FIG. 4.

The light emitting element EL may emit light with a predetermined luminance according to an anode voltage and a cathode voltage. The anode electrode of the light emitting element EL is connected to the first transistor ST1, and the cathode electrode thereof is connected to the second power supply voltage ELVSS terminal. In FIG. 8, the anode electrode of the light emitting element EL corresponds to a pixel electrode 170, and the cathode electrode thereof corresponds to a common electrode 190.

The capacitor Cst is connected between a gate electrode of the first transistor ST1 and the first power voltage ELVDD terminal. The capacitor Cst includes a first capacitor electrode connected to the gate electrode of the first transistor ST1 and a second capacitor electrode connected to the first power voltage ELVDD terminal. The capacitor Cst may be charged with a voltage corresponding to the data signal received from the second transistor ST2.

The first transistor ST1 may be a driving transistor, and the second transistor ST2 may be a switching transistor. Each transistor may include a gate electrode, a source electrode, and a drain electrode. One of the source electrode and the drain electrode may be one electrode, and the other of the source electrode and drain electrode may be the other electrode. Hereinafter, for convenience of explanation, a case in which the drain electrode is one electrode and the source electrode is the other electrode is described as an example.

The first transistor ST1, which is the driving transistor, may generate a driving current. The gate electrode of the first transistor ST1 is connected to the first capacitor electrode. The one electrode of the first transistor ST1 is connected to the first power voltage ELVDD terminal and the second capacitor electrode, and the other electrode of the first transistor ST1 is connected to the anode electrode of the light emitting element EL. The first transistor ST1 may control a driving current flowing through the light emitting element EL in response to an amount of charge stored in the capacitor Cst.

The second transistor ST2 is the switching transistor. The gate electrode of the switching transistor ST2 is connected to the scan line SL. The one electrode of the switching transistor ST2 is connected to the data line DL, and the other electrode of the switching transistor ST2 is connected to the one electrode of the first transistor ST1. The second transistor ST2 may be turned on according to the scan signal of the scan line SL to perform a switching operation of transmitting the data signal to one electrode of the first transistor ST1.

However, this is only an example, and the pixel driving unit PDU may be formed in a 3T1C or 7T1C structure further including a compensation circuit for compensating for a threshold voltage deviation ΔVth of the first transistor ST1.

Each of the plurality of optical sensors PS may include a photoelectric conversion element PD and a sensing driving unit SDU for controlling a sensing current according to a photo current of the photoelectric conversion element PD. The sensing driving unit SDU may include a sensing transistor LT1 and a reset transistor LT2. The sensing transistor LT1 may control the sensing current generated from the photoelectric conversion element PD. The sensing driving unit SDU may receive a reset signal through the reset signal line RSTL connected to the sensing driving unit SDU. The sensing driving unit SDU may receive a fingerprint scan signal through the fingerprint scan line LD. In addition, the sensing driving unit SDU may receive a second power voltage ELVSS and a reset voltage Vrst. In addition, the sensing driving unit SDU is connected to the readout line ROL. In addition, the fingerprint scan line LD may be commonly used with the scan line SL that is connected to the pixel driving unit PDU.

Each of the photoelectric conversion elements PD may be a photodiode including a sensing anode electrode, a sensing cathode electrode, and a photoelectric conversion layer disposed between the sensing anode electrode and the sensing cathode electrode. Each of the photoelectric conversion elements PD may convert light incident from the outside into an electrical signal. The photoelectric conversion element PD may be an inorganic photodiode or a phototransistor formed of a pn-type or pin-type inorganic material. In addition, the photoelectric conversion element PD may also be an organic photodiode including an electron donating material generating donor ions and an electron accepting material generating acceptor ions.

The anode electrode of the photoelectric conversion element PD may be connected to a sensing node LN, and the cathode electrode of the photoelectric conversion element PD may be connected to the second power voltage ELVSS terminal to receive the second power voltage ELVSS. The anode electrode of the photoelectric conversion element PD corresponds to a first electrode 180 of FIG. 8, and the cathode electrode thereof corresponds to a common electrode 190.

When the photoelectric conversion element PD is exposed to external light, photo charges may be generated, and the generated photo charges may be accumulated in the sensing anode electrode of the photoelectric conversion element PD. In this case, a voltage of the sensing node LN electrically connected to the sensing anode electrode may increase. When the photoelectric conversion element PD is connected to the readout line ROL, a sensing voltage may be accumulated in the readout line ROL in proportion to the accumulated voltage of the sensing node LN.

A gate electrode of the sensing transistor LT1 may be connected to the fingerprint scan line LD. One electrode of the sensing transistor LT1 may be connected to the sensing node LN, and the other electrode of the sensing transistor LT1 may be the readout line ROL. The sensing transistor LT1 is turned on according to the fingerprint scan signal of the fingerprint scan line LD and transmits the current flowing through the photoelectric conversion element PD to the readout line ROL.

A gate electrode of the reset transistor LT2 may be connected to the reset signal line RSTL. One electrode of the reset transistor LT2 may be connected to the reset voltage terminal Vrst, and the other electrode of the reset transistor LT2 may be connected to the sensing node LN. In this case, the sensing node LN and the anode electrode of the photoelectric conversion element PD may be reset to the reset voltage Vrst.

In the drawings, the case where each transistor is an NMOS or PMOS transistor is illustrated as an example, but the present invention is not limited thereto.

Figure 4:
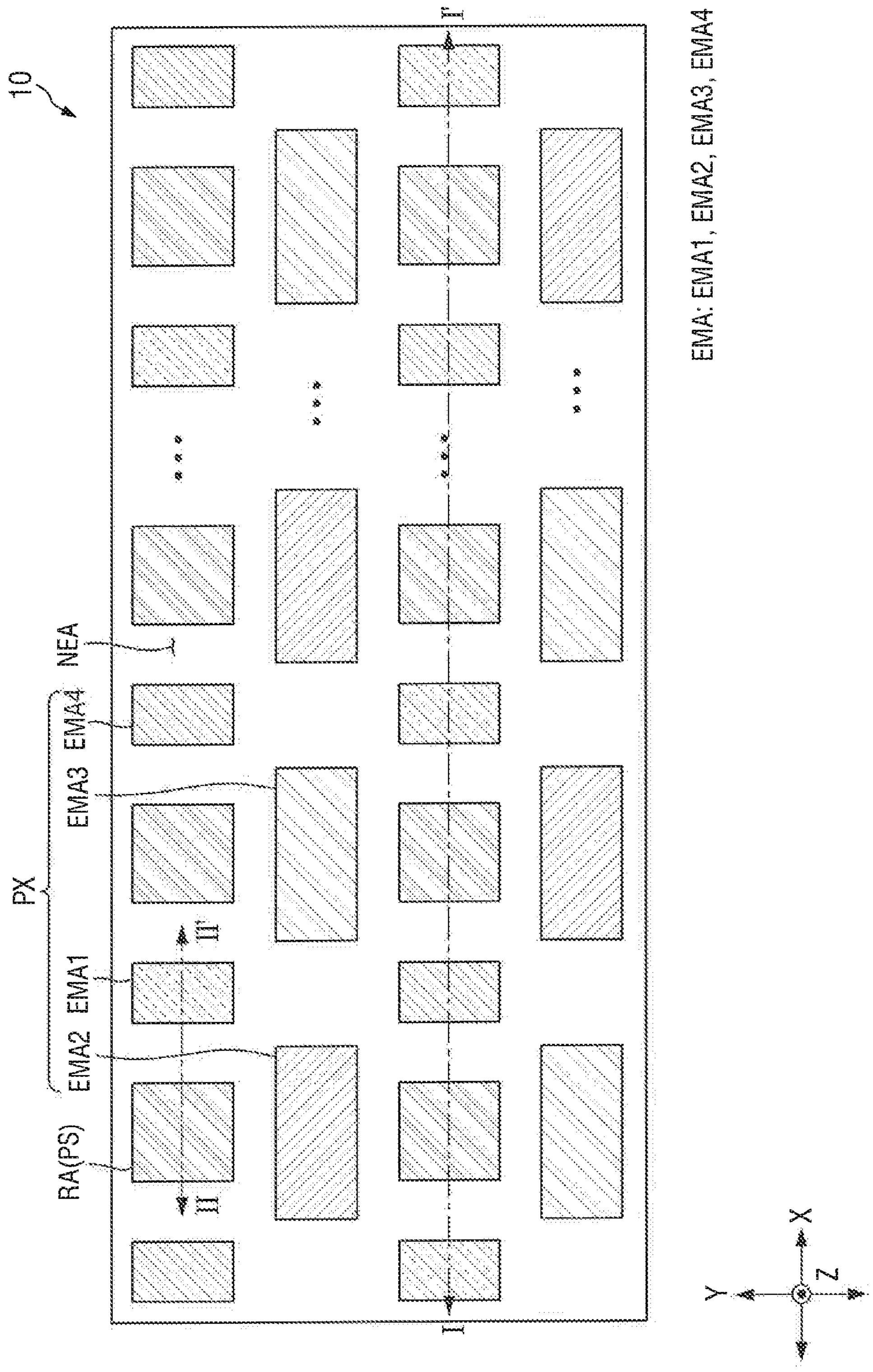
FIG. 4 is a plan layout view of pixels and optical sensors of a display panel according to an of the present invention embodiment of the present invention.
Figure 5A:
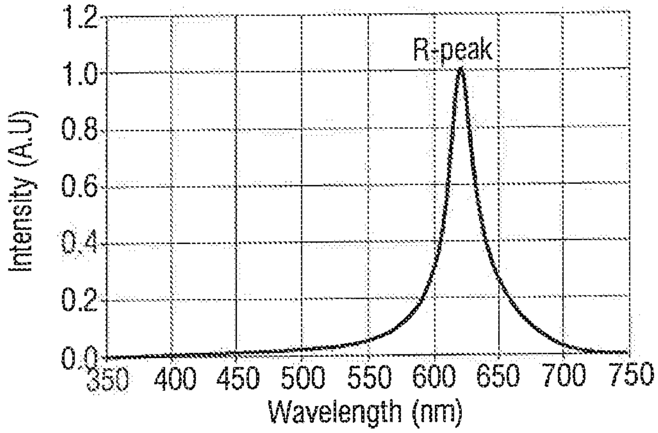
FIGS. 5A, 5B, and 5C are graphs illustrating an example of main peak wavelengths of first to third lights.
Figure 5B:
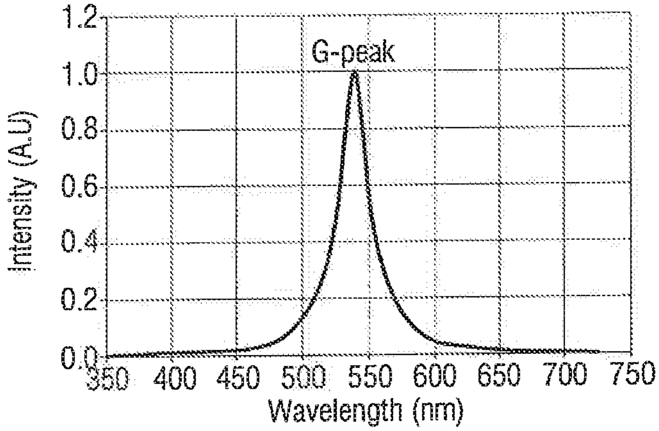
Figure 5C:
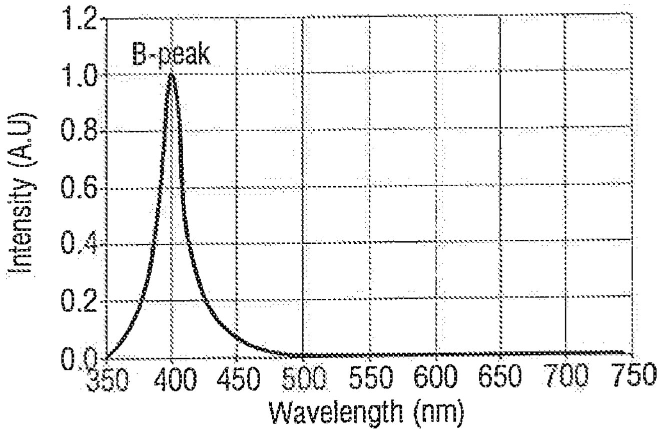

FIG. 4 is a plan layout view of pixels and optical sensors of a display panel according to an embodiment of the present invention. FIGS. 5A to 5C are graphs illustrating an example of main peak wavelengths of first to third lights.

The plurality of pixels PX included in the display panel 10 may include a plurality of light emitting units EMA (EMA1, EMA2, EMA3, and EMA4) that emit light in the active region AAR (or the display region). The plurality of light emitting units EMA may be a region in which a pixel electrode 170 is exposed by an opening of a pixel defining film 160 and a region in which the exposed pixel electrode 170 and a light emitting layer 175 overlap in a cross-sectional view.

A first light emitting unit EMA1 may emit first light of a red wavelength band. The first light may have a wavelength of approximately 600 nm to approximately 750 nm (R-peak in FIG. 5A), but the present invention herein is not limited thereto.

A second light emitting unit EMA2 and a fourth light emitting unit EMA4 may emit second light of a green wavelength band. The second light may have a wavelength of approximately 480 nm to approximately 560 nm (G-peak in FIG. 5B), but the present invention herein is not limited thereto.

A third light emitting unit EMA3 may emit first light of a blue wavelength band. The third light may have a wavelength of approximately 370 nm to approximately 460 nm (B-peak in FIG. 5C), but the present invention herein is not limited thereto.

The first light emitting unit EMA1, the second light emitting unit EMA2, the third light emitting unit EMA3, and the fourth light emitting unit EMA4 may form one unit pixel. One unit pixel may be the smallest unit of pixels PX for displaying white light.

The plurality of light sensors PS included in the display panel 10 may include a plurality of light sensing units RA that sense incident light within the active region AAR (or the light sensing region). The light sensing unit RA may be a region in which the first electrode 180 is exposed by the opening of the pixel defining film 160 and a region in which the exposed first electrode 180 and the photoelectric conversion layer 185 overlap in a cross-sectional view.

Although not limited thereto, the light sensing unit RA may absorb the second light of the green wavelength band emitted from the second light emitting unit EMA2 or the fourth light emitting unit EMA4 adjacent thereto and convert the second light into an electrical signal. Unlike this, the light sensing unit RA may recognize the first light of the red wavelength band or the third light of the blue wavelength band as a noise signal, while the optical sensor PS may recognize light of a red wavelength or light of a blue wavelength as a noise signal.

A non-light emitting region is disposed between the light emitting units EMA of each pixel PX. In addition, a non-sensing region is disposed between the light sensing units RA of each optical sensor PS. In the present embodiment, a region in which the non-light emitting region and the non-sensing region overlap will be referred to as a peripheral region NEA.

The plurality of light emitting units EMA1, EMA2, EMA3, and EMA4 may be disposed to be spaced apart from each other in the first direction X and the second direction Y. For example, the first light emitting unit EMA1 and the third light emitting unit EMA3 may be alternately arranged in the first direction X and the second direction Y. For example, the first light emitting unit EMA1 and the third light emitting unit EMA3 may be misaligned with each other in the first direction X and the second direction Y. The second light emitting unit EMA2 and the fourth light emitting unit EMA4 may be alternately arranged in the first direction X and the second direction Y. For example, the first light emitting unit EMA2 and the third light emitting unit EMA4 may be misaligned with each other in the first direction X and the second direction Y.

The light sensing unit RA may be adjacent to the plurality of light emitting units EMA1, EMA2, EMA3, and EMA4. For example, the light sensing unit RA may be disposed between the second light emitting unit EMA2, which is adjacent to the light sensing unit RA in the second direction Y, and the fourth light emitting unit EMA4, which is adjacent to the light sensing unit RA in the first direction X, and may be disposed between the first light emitting unit EMA1, which is adjacent to the light sensing unit RA in the first direction X, and the third light emitting unit EMA3, which is adjacent to the light sensing unit RA in the second direction Y.

Each of the plurality of light emitting units EMA1, EMA2, EMA3, and EMA4 may have different sizes from each other. For example, the size of the first light emitting unit EMA1 may be smaller than the size of the second light emitting unit EMA2 and the third light emitting unit EMA3 and may be larger than the size of the fourth light emitting unit EMA4. The size of the second light emitting unit EMA2 may be substantially the same as the size of the third light emitting unit EMA3. However, the present invention is not limited thereto. For example, the first light emitting unit EMA1 may be smaller than or substantially the same size as the fourth light emitting unit EMA4, and the size of the second light emitting unit EMA2 may have a size different from that of the third light emitting unit EMA3.

The first light emitting unit EMA1, the second light emitting unit EMA2, the third light emitting unit EMA3, the fourth light emitting unit EMA4, and the light sensing unit RA may have a quadrangular planar shape, but are not limited thereto, and may have a rhombus, octagonal, or other polygonal planar shapes.

Figure 6:
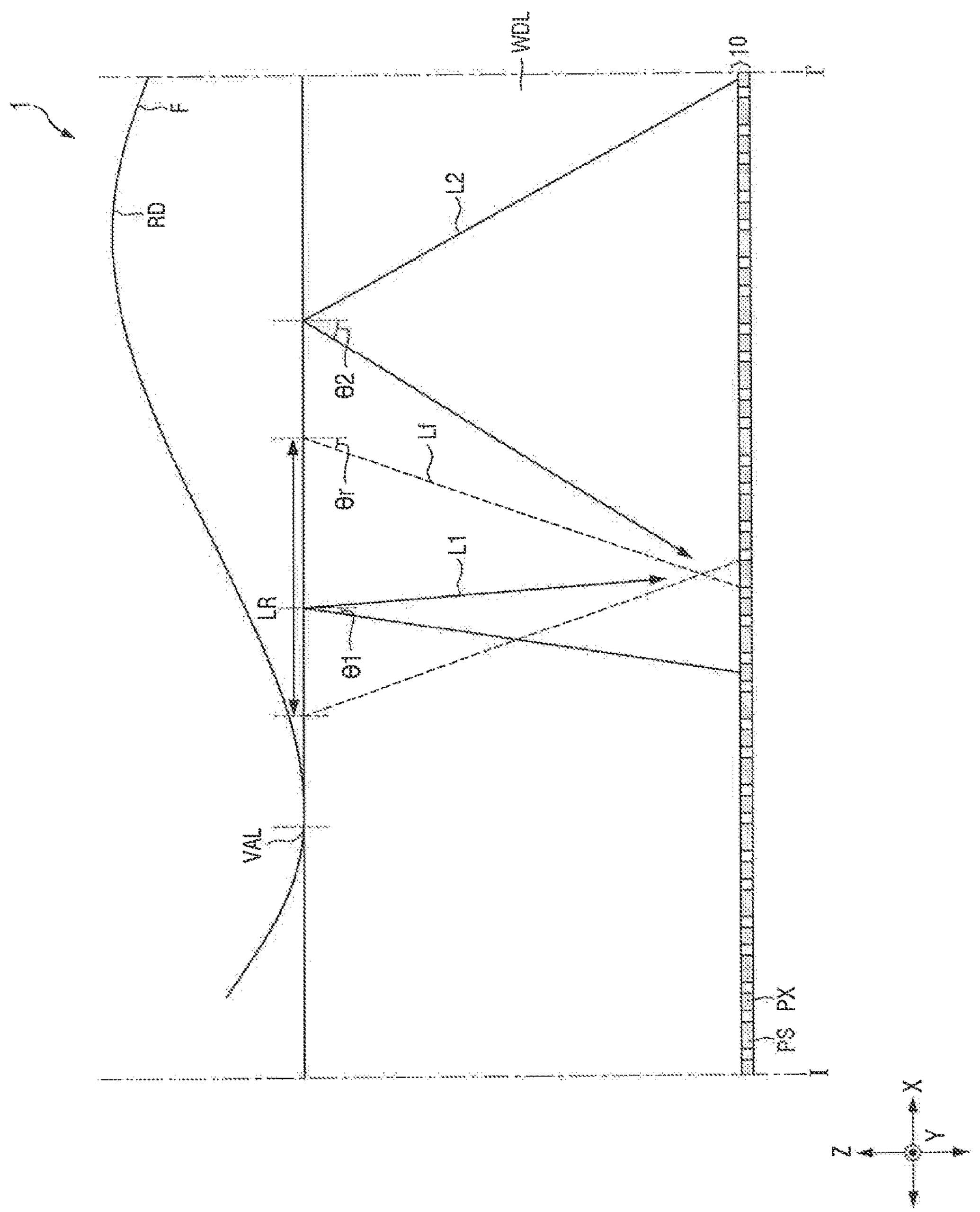
FIG. 6 is a cross-sectional view illustrating an example of the display device taken along line I-I' of FIG. 4.

FIG. 6 is a cross-sectional view illustrating an example of the display device taken along line I-I' of FIG. 4.

Referring to FIG. 6, the display device 1 may further include a window WDL disposed on the display panel 10. The optical sensor PS and the pixel PX of the display panel 10 may be alternately disposed along one direction.

When a user's finger comes into contact with an upper surface of the window WDL of the display device 1, light output from the pixels PX of the display panel 10 may be reflected from a ridge RID of a user's fingerprint F and valleys VAL between the ridges RID of the user's fingerprint F. In this case, the ridge RID portion of the fingerprint F is in contact with the upper surface of the window WDL, whereas the valley VAL portion of the fingerprint F is not in contact with the window WDL. For example, the upper surface of the window WDL is in contact with air in the valley VAL portion.

When the fingerprint F is in contact with the upper surface of the window WDL, the light output from the light emitting unit of the pixel PX may be reflected from the ridge RID and the valley VAL of the fingerprint F. In this case, since a refractive index of the fingerprint F and a refractive index of air are different from each other, the amount of light reflected from the ridge RID of the fingerprint F and the amount of light reflected from the valley VAL thereof may be different from each other. Accordingly, the ridge RID portion and the valley VAL portion of the fingerprint F may be derived based on a difference in the amount of reflected light, that is, light incident on the optical sensor PS. Since the optical sensor PS outputs an electrical signal (i.e., photo current) according to the difference in the amount of light, a pattern of the fingerprint F of the finger may be identified.

A region LR of light incident on the optical sensor PS (hereinafter, referred to as a fingerprint sensing region) may be defined by a set of reference lights Lf incident on the optical sensor PS with a reference angle θr.

A plurality of lights L1 and L2 emitted from the pixel PX may be reflected at a surface of the window WDL to be incident on the optical sensor PS. The lights L1 and L2 incident on the optical sensor PS may be a sensing signal for fingerprint sensing or a noise signal that interferes with fingerprint sensing. For example, front light incident on the optical sensor PS in a front direction as compared to the reference light Lf of the fingerprint sensing region LR may be the sensing signal for fingerprint sensing of the optical sensor PS. In addition, side light incident on the optical sensor PS in a side direction as compared to the reference light Lf of the fingerprint sensing region LR may be the noise signal that interferes with fingerprint sensing of the optical sensor PS.

For example, the first light L1 incident on the optical sensor PS with a first angle θ1, which is smaller than the reference angle θr, may correspond to the sensing signal of the optical sensor PS. The second light L2 incident on the optical sensor PS with a second angle θ2, which is greater than the reference angle θr, may be the noise signal.

Accordingly, as the amount of the first light L1 incident on the optical sensor PS in the front direction increases and the amount of the second light L2 incident on the optical sensor PS in the side direction decreases, a ratio of the sensing signal to the noise signal that may be recognized by the optical sensor PS may increase. Accordingly, the display device 1 may identify an accurate fingerprint pattern.

In addition, as the fingerprint sensing region LR is smaller, a region in which the fingerprint F is acquired may be smaller. As the region in which the fingerprint F is acquired is smaller, the ridge RID and/or the valley VAL of the fingerprint may be accurately sensed, and thus the accuracy of fingerprint sensing may be increased. Although not limited thereto, an accurate fingerprint pattern may be identified when a width of the fingerprint sensing region LR in one direction is about 662 μm or less.

Hereinafter, factors determining the fingerprint sensing region LR according to an exemplary embodiment will be described with reference to FIG. 7.

Figure 7:
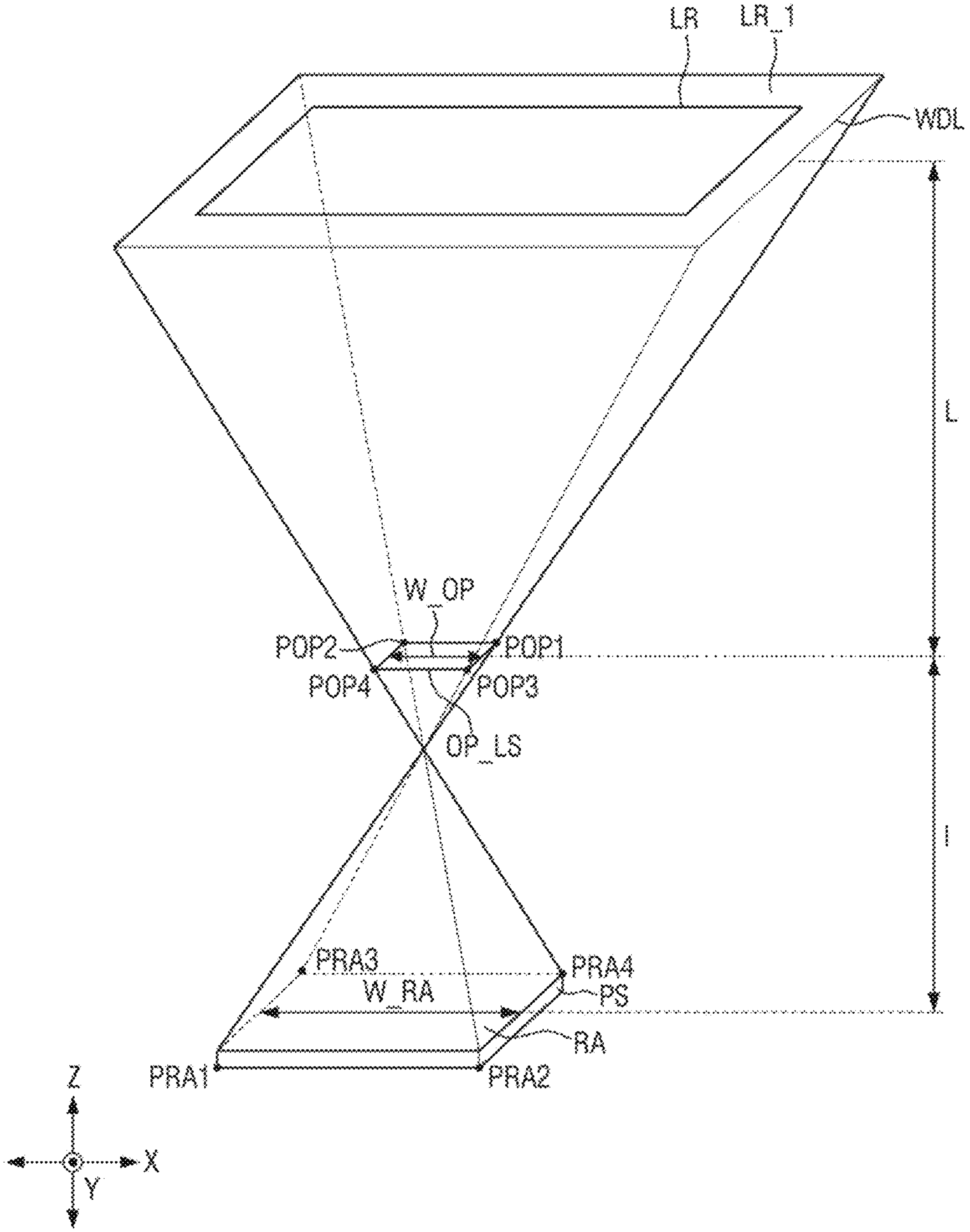
FIG. 7 is an example illustrating a fingerprint sensing region of a display device according to an embodiment of the present invention.

FIG. 7 is an example illustrating a fingerprint sensing region of a display device according to an embodiment of the present invention.

In general, a fingerprint sensing region LR_1 of the display device may be set by a light sensing unit RA and an opening OP_LS of a light blocking layer LS disposed on the light sensing unit RA. For example, the fingerprint sensing region LR_1 may be set by points at which a line connecting a first vertex PRA1 of the light sensing unit RA and a first vertex POP1 of the opening OP_LS, a line connecting a second vertex PRA2 of the light sensing unit RA and a second vertex POP2 of the opening OP_LS, a line connecting a third vertex PRA3 of the light sensing unit RA and a third vertex POP3 of the opening OP_LS, and a line connecting a fourth vertex PRA4 of the light sensing unit RA and a fourth vertex POP4 of the opening OP_LS meets the upper surface of the window WDL.

Therefore, the fingerprint sensing region LR_1 may vary depending on a width W_RA of the light sensing unit RA, a width W_OP of the opening OP_LS of the light blocking layer LS, a distance L between the light blocking layer LS and the window WDL, and a distance 1 between the light blocking layer LS and the optical sensor PS.

For example, as the width W_RA of the light sensing unit RA decreases, the fingerprint sensing region LR_1 may decrease. As another example, as the distance L between the light blocking layer LS and the window WDL decreases, the fingerprint sensing region LR_1 may decrease, and as the distance 1 between the light blocking layer LS and the optical sensor PS increases, the fingerprint sensing region LR_1 may decrease.

In addition, as the width W_OP of the opening OP_LS decreases, the fingerprint sensing region LR may decrease. However, when the width W_OP of the opening OP_LS is narrowed, an aperture ratio of the light sensing unit RA may decrease. Accordingly, a ratio of the first light ("L1" in FIG. 6) incident on the light sensing unit RA may decrease. When the first light L1 decreases, the sensing signal of the optical sensor PS decreases, and thus the accuracy of fingerprint sensing may decrease. Accordingly, even if the fingerprint sensing region LR_1 is reduced by narrowing the width W_OP of the opening OP_LS, the accuracy of fingerprint sensing might not increase.

The display device 1 according to the present embodiment may reduce the fingerprint sensing region LR without reducing the width W_OP of the opening OP_LS. For example, since the width W_OP of the opening OP_LS is maintained, the ratio of the first light L1 contributing to the sensing signal of the optical sensor PS may be maintained. Accordingly, the accuracy of fingerprint sensing by the optical sensor PS may increase.

Hereinafter, a cross-sectional structure of a display device 1_1 according to an embodiment of the present invention will be described in detail.

Figure 9:
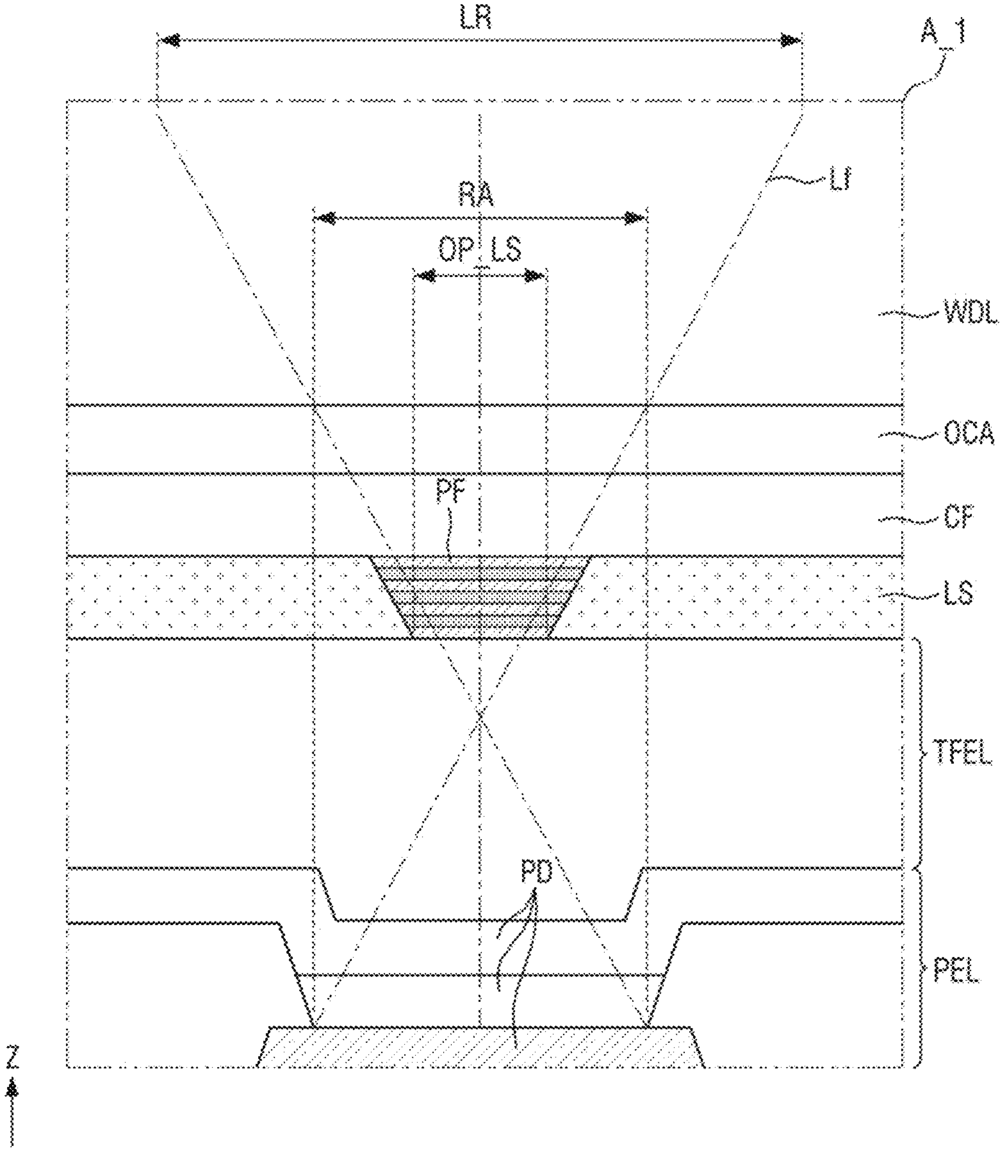
FIG. 9 is an enlarged cross-sectional view of portion A of FIG. 8.
Figure 10:
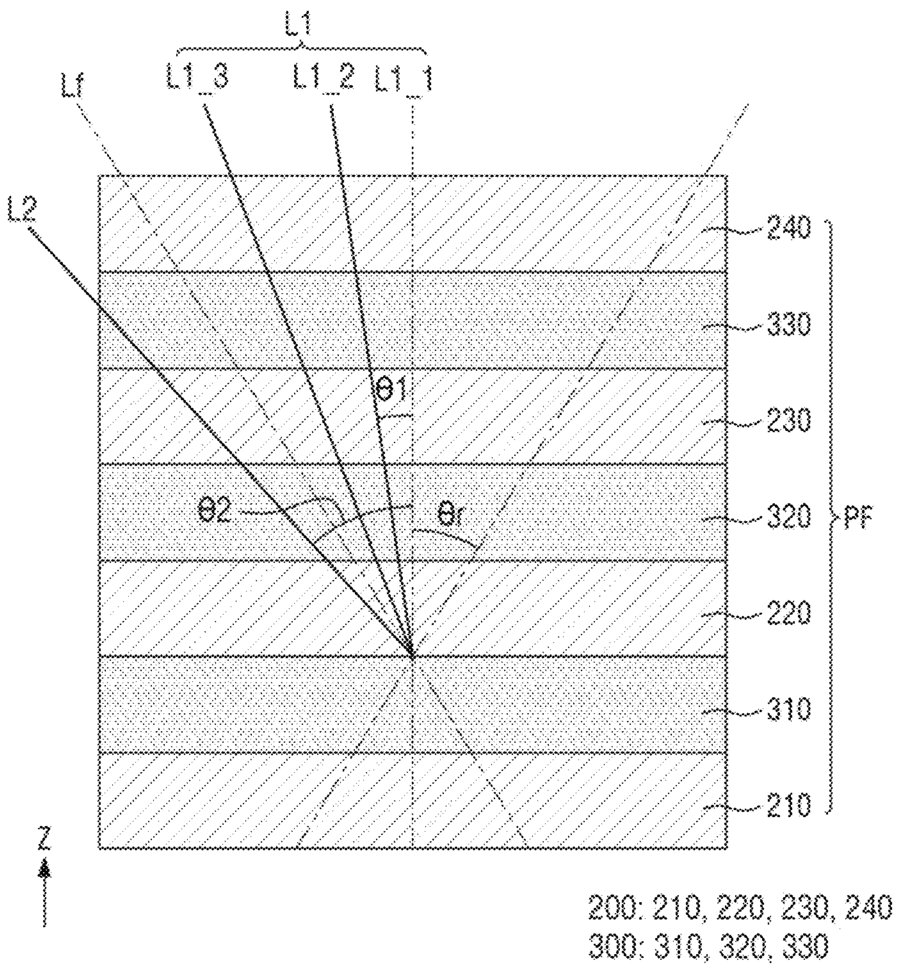
FIG. 10 is an enlarged cross-sectional view of an optical filter according to an embodiment of the present invention.

FIG. 8 is a cross-sectional view illustrating an example of the display device taken along II-II' of FIG. 4. FIG. 9 is an enlarged cross-sectional view of portion A of FIG. 8. FIG. 10 is an enlarged cross-sectional view of an optical filter according to an embodiment of the present invention.

The display device 1_1 may include a substrate SUB, and a thin film transistor layer TFTL, a photoelectric element layer PEL, an encapsulation layer TFEL, a light blocking layer LS, an optical filter PF, a color filter CF, a transparent adhesive member OCA, and a window WDL on the substrate SUB, which are sequentially disposed in the third direction Z.

The substrate SUB may be a rigid substrate or a flexible substrate capable of being bent, folded, rolled, or the like. The substrate SUB may be made of an insulating material such as glass, quartz, or a polymer resin.

A buffer film 110 may be disposed on one surface of the substrate SUB. The buffer film 110 may include, for example, silicon nitride, silicon oxide, or silicon oxynitride.

The thin film transistor layer TFTL disposed on the buffer film 110 may include a first thin film transistor TFT1 and a second thin film transistor TFT2. The first thin film transistor TFT1 may be one of the first transistor ST1 or the second transistor T2 illustrated in FIG. 3. The second thin film transistor TFT2 may be one of the first and second sensing transistors LT1 and LT2 illustrated in FIG. 3.

A plurality of thin film transistors TFT1 and TFT2 may include semiconductor layers A1 and A2, a gate insulating layer 121 disposed on a portion of the semiconductor layers A1 and A2, gate electrodes G1 and G2 disposed on the gate insulating layer 121, an interlayer insulating film 122 covering each of the semiconductor layers A1 and A2 and each of the gate electrodes G1 and G2, and source electrodes S1 and S2 and drain electrodes D1 and D2 disposed on the interlayer insulating film 122.

The semiconductor layers A1 and A2 may form channels of the first thin film transistor TFT1 and the second thin film transistor TFT2, respectively. The semiconductor layers A1 and A2 may include polycrystalline silicon. In an embodiment of the present invention, the semiconductor layers A1 and A2 may include, for example, single crystal silicon, low temperature polycrystalline silicon, amorphous silicon, or an oxide semiconductor. The oxide semiconductor may include, for example, a binary compound (ABx), a ternary compound (ABxCy), and a quaternary compound (ABxCyDz) including, for example, indium, zinc, gallium, tin, titanium, aluminum, hafnium (Hf), zirconium (Zr), magnesium (Mg), and the like. Each of the semiconductor layers A1 and A2 may include a channel region, and a source region and a drain region doped with impurities.

The gate insulating layer 121 is disposed on the semiconductor layers A1 and A2. The gate insulating layer 121 electrically insulates the first gate electrode G1 from the first semiconductor layer A1 and electrically insulates the second gate electrode G2 from the second semiconductor layer A2. The gate insulating layer 121 may be formed of an insulating material, for example, silicon oxide (SiOx), silicon nitride (SiNx), or metal oxide.

The first gate electrode G1 of the first thin film transistor TFT1 and the second gate electrode G2 of the second thin film transistor TFT2 are disposed on the gate insulating layer 121. The gate electrodes G1 and G2 may be formed on the gate insulating layer 121, and may respectively overlap the channel regions of the semiconductor layers A1 and A2.

The interlayer insulating film 122 may be disposed on the gate electrodes G1 and G2. The interlayer insulating film 122 may include an inorganic insulating material such as silicon oxide (SiOx), silicon nitride (SiNx), silicon oxynitride, hafnium oxide, or aluminum oxide. In addition, the interlayer insulating film 122 may include a plurality of insulating films, and may further include a conductive layer forming a second capacitor electrode between the insulating films.

The source electrodes S1 and S2 and the drain electrodes D1 and D2 are disposed on the interlayer insulating film 122. A first source electrode S1 of the first thin film transistor TFT1 may be electrically connected to a drain region of the first semiconductor layer A1 through a contact hole penetrating through the interlayer insulating film 122 and the gate insulating layer 121. A second source electrode S2 of the second thin film transistor TFT2 may be electrically connected to a drain region of the second semiconductor layer A2 through a contact hole penetrating through the interlayer insulating film 122 and the gate insulating layer 121. Each of the source electrodes S1 and S2 and the drain electrodes D1 and D2 may include one or more metals of, for example, aluminum (Al), molybdenum (Mo), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu).

A planarization layer 130 may be formed on the interlayer insulating film 122 to cover each of the source electrodes S1 and S2 and the drain electrodes D1 and D2. The planarization layer 130 may be formed of an organic insulating material or the like. The planarization layer 130 may have a flat surface and may include a contact hole exposing one of the source electrodes S1 and S2 and the drain electrodes D1 and D2, respectively.

A photoelectric element layer PEL may be disposed on the planarization layer 130. The photoelectric element layer PEL may include a light emitting element EL, a photoelectric conversion element PD, and a pixel defining film 160. The light emitting element EL may include a pixel electrode 170, a light emitting layer 175, and a common electrode 190, and the photoelectric conversion element PD may include a first electrode 180, a photoelectric conversion layer 185, and a common electrode 190. The light emitting elements EL and the photoelectric conversion elements PD may share the common electrode 190.

The pixel electrode 170 of the light emitting element EL may be disposed on the planarization layer 130. The pixel electrode 170 may be provided for each pixel PX. The pixel electrode 170 may be connected to the first source electrode S1 or the first drain electrode D1 of the first thin film transistor TFT1 through a contact hole penetrating through the planarization layer 130.

The pixel electrode 170 of the light emitting element EL is not limited thereto, but may have a single layer structure of, for example, molybdenum (Mo), titanium (Ti), copper (Cu), or aluminum (Al), or may have a stacked layer structure, for example, a multilayer structure of Indium-Tin-Oxide (ITO), Indium-Zinc-Oxide (IZO), Zinc Oxide (ZnO), Indium Oxide ($In_2O_3$), and ITO/Mg, ITO/MgF, ITO/Ag, and ITO/Ag/ITO including silver (Ag), magnesium (Mg), aluminum (Al), platinum (Pt), lead (Pb), gold (Au), and nickel (Ni).

In addition, the first electrode 180 of the photoelectric conversion element PD may be disposed on the planarization layer 130. The first electrode 180 may be provided for each optical sensor PS. The first electrode 180 may be connected to the second source electrode S2 or the second drain electrode D2 of the second thin film transistor TFT2 through a contact hole penetrating through the planarization layer 130.

The first electrode 180 of the photoelectric conversion element PD is not limited thereto, but may have a single layer structure of, for example, molybdenum (Mo), titanium (Ti), copper (Cu), or aluminum (Al), or may have a multilayer structure of, for example, ITO/Mg, ITO/MgF, ITO/Ag, and ITO/Ag/ITO.

The pixel defining film 160 may be disposed on the pixel electrode 170 and the first electrode 180. The pixel defining film 160 may include an opening that is formed in a region overlapping the pixel electrode 170 and exposes the pixel electrode 170. A region, in which the exposed pixel electrode 170 and the light emitting layer 175 overlap, may be defined as first to fourth light emitting units EMA1, EMA2, EMA3, and EMA4 of each pixel PX.

In addition, the pixel defining film 160 may include an opening that is formed in a region overlapping the first electrode 180 and exposes the first electrode 180. The opening exposing the first electrode 180 provides a space in which the photoelectric conversion layer 185 of each optical sensor PS is formed, and a region, in which the exposed first electrode 180 and the photoelectric conversion layer 185 overlap, may be defined as a light sensing unit RA.

The pixel defining film 160 may include an organic insulating material such as a polyacrylates resin, an epoxy resin, a phenolic resin, a polyamides resin, a polyimides resin, an unsaturated polyesters resin, a polyphenyleneethers resin, a polyphenylenesulfides resin, or benzocyclobutene (BCB). As another example, the pixel defining film 160 may also include an inorganic material such as silicon nitride.

A light emitting layer 175 may be disposed on the pixel electrode 170 of the light emitting element EL exposed by the opening of the pixel defining film 160. The light emitting layer 175 may include a high molecular material or a low molecular material, and may emit red, green, or blue light for each pixel PX. The light emitted from the light emitting layer 175 may contribute to image display or function as a light source of light incident on the optical sensor PS. For example, light of a green wavelength emitted from the second light emitting unit EMA2 and the fourth light emitting unit EMA4 of the pixel PX may function as a light source of light incident on the light sensing unit RA of the optical sensor PS. However, the present invention is not limited thereto, and the red light or blue light incident on the light sensing unit RA may function as a light source.

When the light emitting layer 175 is formed of an organic material, a hole injecting layer HIL and a hole transporting layer HTL may be disposed on a lower side of each light emitting layer 175 as a center, and an electron injecting layer EIL and an electron transporting layer ETL may be stacked on an upper side of each light emitting layer 175 as a center. These layers may be a single layer or multiple layers made of the organic material.

A photoelectric conversion layer 185 may be disposed on the first electrode 180, of the photoelectric conversion element PD, that is exposed by the opening of the pixel defining film 160. The photoelectric conversion layer 185 may generate photo charges in proportion to incident light. The incident light may be light emitted from the light emitting layer 175 and then reflected and entered, or may be light provided from the outside regardless of the light emitting layer 175. The charges generated and accumulated in the photoelectric conversion layer 185 may be converted into electrical signals for sensing.

The photoelectric conversion layer 185 may include an electron donating material and an electron accepting material. The electron donating material may generate donor ions in response to light, and the electron accepting material may generate acceptor ions in response to light. When the photoelectric conversion layer 185 is formed of the organic material, the electron donating material may include a compound such as subphthalocyanine (SubPc) or dibutylphosphate (DBP), but the present invention is not limited thereto. The electron accepting material may include a compound such as fullerene, a fullerene derivative, or perylene diimide, but the present invention is not limited thereto.

When the photoelectric conversion layer 185 is formed of the organic material, a hole injecting layer HIL and a hole transporting layer HTL may be disposed on a lower side of each photoelectric conversion layer 185 as a center, and an electron injecting layer EIL and an electron transporting layer ETL may be stacked on an upper side of each photoelectric conversion layer 185 as a center. These layers may be a single layer or multiple layers made of the organic material.

A common electrode 190 may be disposed on the light emitting layer 175, the photoelectric conversion layer 185, and the pixel defining film 160. The common electrode 190 may be disposed across all of the plurality of pixels PX and the plurality of optical sensors PS in a form covering the light emitting layer 175, the photoelectric conversion layer 185, and the pixel defining film 160. The common electrode 190 may include a conductive material having a low work function, for example, Li, Ca, LiF/Ca, LiF/Al, Al, Mg, Ag, Pt, Pd, Ni, Au Nd, Ir, Cr, BaF, Ba, or a compound or mixture thereof (e.g., a mixture of Ag and Mg, etc.). In addition, the common electrode 190 may include a transparent metal oxide, for example, indium-tin-oxide (ITO), indium-zinc-oxide (IZO), or zinc oxide (ZnO).

An encapsulation layer TFEL may be disposed on the photoelectric element layer PEL. The encapsulation layer TFEL may include at least one inorganic film and one organic film to prevent oxygen or moisture from permeating into each of the light emitting layer 175 and the photoelectric conversion layer 185, and/or to protect the light emitting layer 175 and the photoelectric conversion layer 185 from foreign substances such as dust. For example, the encapsulation layer TFEL may be formed in a structure in which a first inorganic film, an organic film, and a second inorganic film are sequentially stacked on each other. The first inorganic film and the second inorganic film may be formed of multiple films in which one or more inorganic films of, for example, a silicon nitride layer, a silicon oxynitride layer, a silicon oxide layer, a titanium oxide layer, and an aluminum oxide layer are alternately stacked. The organic film may be an organic film made of an acrylic resin, an epoxy resin, a phenolic resin, a polyamide resin, or a polyimide resin.

A light blocking layer LS may be disposed on an upper side of the encapsulation layer TFEL. The light blocking layer LS may partially block light emitted from the light emitting unit EMA and/or may partially block light incident from the light sensing unit RA. The light blocking layer LS may include an organic light blocking material using a pigment (e.g., carbon black) or a resin material including a dye. Accordingly, the light blocking layer LS may prevent color mixing caused by intrusion of light between the adjacent light emitting units EMA.

The light blocking layer LS may be disposed to not overlap the light emitting unit EMA in the third direction Z so that light having a total reflection angle among the lights emitted from the light emitting unit EMA of each pixel PX is not blocked by the light blocking layer LS.

In addition, the light blocking layer LS may be disposed to overlap the light sensing unit RA to secure the fingerprint sensing region ("LR" in FIG. 7). For example, the opening OP_LS of the light blocking layer LS may overlap the light sensing unit RA in the third direction Z, and may have a width smaller than the width of the light sensing unit RA in one direction. For example, the light blocking layer LS may overlap the photoelectric conversion layer 185 of the photoelectric conversion element PD in the third direction Z.

Referring to FIG. 10 together with FIGS. 8 and 9, an optical filter PF may be disposed in the opening OP_LS of the light blocking layer LS. The optical filter PF may have a multilayer structure in which a plurality of low refractive layers 200 (210, 220, 230, and 240) and a plurality of high refractive layers 300 (310, 320, and 330) are alternately disposed on each other. A refractive index of each of the plurality of high refractive layers 300 may be greater than a refractive index of each of the plurality of low refractive layers 200. For example, the refractive index of each of the plurality of low refractive layers 200 may be about 1.4 to about 1.6, and the refractive index of each of the plurality of high refractive layers 300 may be about 1.6 to about 2.5, but the present invention is not limited thereto.

The optical filter PF may include a plurality of multilayer structures selected from dielectrics $SiO_2$, $TiO_2$, $ZrO_2$, $Ta_2O5$, $HfO_2$, $Al_2O_3$, ZnO, $Y_2O_3$, BeO, MgO, $PbO_2$, $WO_3$, VOX, SiNX, eNX, AlN, ZnS, CdS, SiC, SiCN, MgF, $CaF_2$, NaF, $BaF_2$, $PbF_2$, LiF, LaF3, GaP, and $AlO_x$.

The plurality of low refractive layers 200 and the plurality of high refractive layers 300 may be alternately disposed on each other in the third direction Z. For example, a first low refractive layer 210, a first high refractive layer 310, a second low refractive layer 220, a second high refractive layer 320, a third low refractive layer 230, a third high refractive layer 330, and a fourth low refractive layer 240 may be sequentially disposed in the third direction Z.

The low refractive layers 200 may be configured as a lower surface and an upper surface of the optical filter PF, respectively. For example, the first low refractive layer 210 may be a lower surface of the optical filter PF, and the fourth low refractive layer 240 may be an upper surface of the optical filter PF. In this case, since the refractive index of the first low refractive layer 210 is similar to that of the encapsulation layer TFEL, external light may be transmitted without being reflected at an interface even if the external light travels from the first low refractive layer 210 to the encapsulation layer TFEL. Similarly, since the refractive index of the fourth low refractive layer 240 is similar to that of the color filter CF, external light may be transmitted without being reflected at an interface (e.g., a surface) even if the external light travels from the color filter CF to the fourth low refractive layer 240. However, the present invention is not limited thereto, and the high refractive layers 300 may be configured as a lower surface and an upper surface of the optical filter PF, respectively.

According to the present embodiment of the present invention, since the optical filter PF disposed in the opening OP_LS of the light blocking layer LS includes the plurality of low refractive layers 200 and the plurality of high refractive layers 300, the fingerprint sensing region LR may be reduced. For example, since an interference effect of light increases as the plurality of low refractive layers 200 and the plurality of high refractive layers 300 are alternately disposed with each other, a ratio of the second light L2 incident in the side direction compared to the reference light Lf serving as a reference of the fingerprint sensing region LR may be reduced. In addition, a ratio of the first light L1 incident in the front direction compared to the reference light Lf may increase.

For example, reflection or transmission of light may occur at interfaces between the low refractive layers 200 and the high refractive layers 300. For example, reflected light reflected from the upper surface of the window WDL may be reflected at an interface as it travels from the fourth low refractive layer 240 to the third high refractive layer 330 of the optical filter PF. As another example, the reflected light may transmit through the interface between the fourth low refractive layer 240 and the third high refractive layer 330 of the optical filter PF, but may be reflected at an interface between the third high refractive layer 330 and the third low refractive layer 230. As described above, as the plurality of reflected lights are reflected or transmitted at the interface between the high refractive layer 300 and the low refractive layer 200, path lengths of the reflected lights may be different. Accordingly, the second light L2 recognized as the noise signal may be minimized and the first light L1 recognized as the sensing signal may be increased due to the interference effect of the reflected lights having different path lengths. The first lights L1 may transmit through the optical filter PF to be incident on the photoelectric conversion element PD, and the second lights L2 may be reflected without transmitting through the optical filter PF.

Therefore, the display device 1_1 may increase the ratio of the first light L1 to the second light L2 and minimize the reference angle θr of the reference light Lf due to the interference effect of the optical filter PF even without reducing the opening OP_LS of the light blocking layer LS. Accordingly, the fingerprint sensing region LR defined by the set of reference lights Lf may be minimized, and the accuracy of fingerprint sensing may be increased.

In addition, in the present embodiment, the four low refractive layers 200 and the three high refractive layers 300 have been exemplified as being alternately disposed, but the present invention is not limited thereto. For example, even if two pairs of refractive layers, that is, two low refractive layers 200 and two high refractive layers 300 are alternately disposed, the same interference effect may be implemented. Since the interference effect may increase as the number of the refractive layers alternately disposed increases, it is desirable to include a plurality of refractive layers.

Although not limited thereto, a thickness of the light blocking layer LS may be about 1 to about 2 μm, and a thickness of the optical filter PF may be about 1 to about 3 μm. Therefore, the thickness of the light blocking layer LS may be smaller or greater than the thickness of the optical filter PF. In addition, as an example, the thickness of the light blocking layer LS may be substantially the same as that of the thickness of the optical filter PF.

The light blocking layer LS and the optical filter PF may be covered by the color filter CF. The color filter CF may selectively transmit, absorb, or block light. The color filter CF may be a resin material including a dye or a pigment.

The color filter CF may transmit the second light of the green wavelength band and absorb or block the first light of the red wavelength band and the third light of the blue wavelength band. As will be described later with reference to FIGS. 11 and 15, since the optical filter PF transmits the second light and reflects the first light and the third light, the first light and the third light reflected from the optical filter PF may be visually recognized from the outside of the display device 1_1. Therefore, the color filter CF may prevent the reflected light from being visually recognized from the outside by absorbing or blocking the first light and the third light.

A window WDL may be disposed on an upper surface of the color filter CF. The window WDL may be a protective member that may protect the upper surface of the display panel 10. The window WDL may include a rigid material such as glass or quartz. The window WDL may be adhered to the display panel 10 by a transparent adhesive member OCA. A refractive index of the window WDL may be about 1.4 to about 1.6. The refractive index of the low refractive layers 200 of the optical filter PF may be smaller than or greater than the refractive index of the window WDL.

Figure 11:
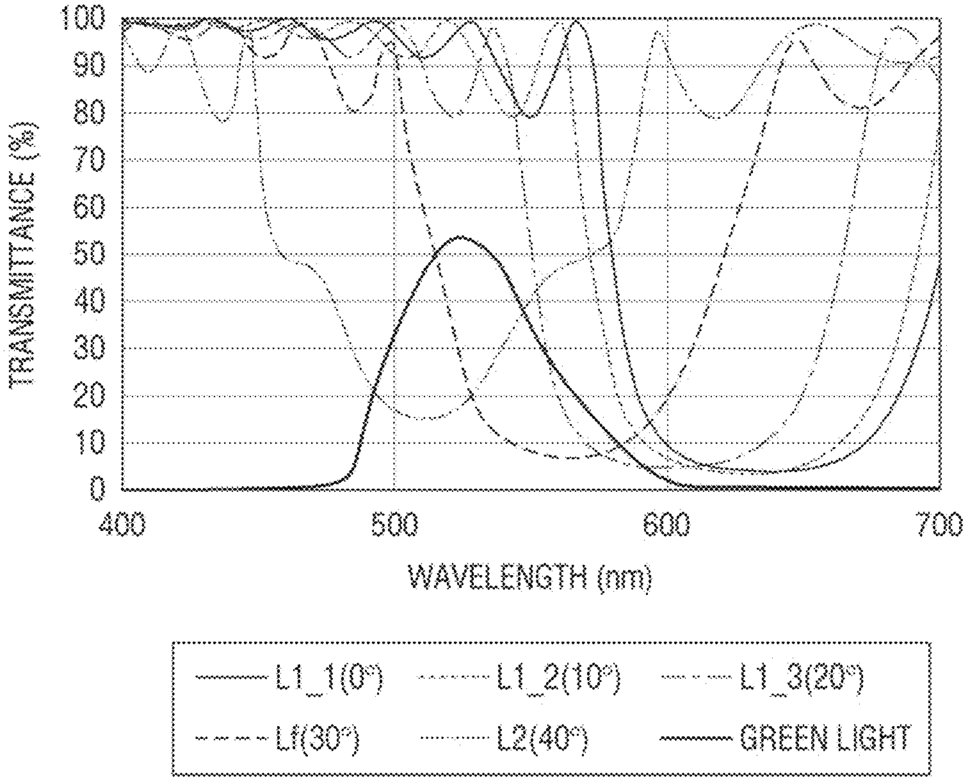
FIG. 11 is a graph illustrating a relationship between a wavelength and transmittance of light incident on an optical filter at a predetermined angle according to an embodiment of the present invention.
Figure 12:
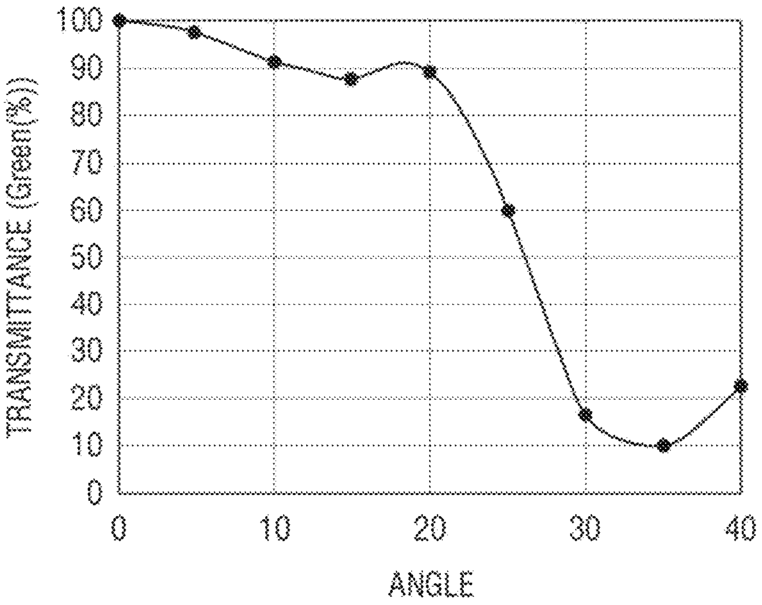
FIG. 12 is a graph illustrating transmittance of green light according to an angle of light incident on an optical filter according to an embodiment of the present invention.

FIG. 11 is a graph illustrating a relationship between a wavelength and transmittance of light incident on an optical filter at a predetermined angle according to an embodiment of the present invention. FIG. 12 is a graph illustrating transmittance of green light according to an angle of light incident on an optical filter according to an embodiment of the present invention.

In FIG. 11, an X-axis is a wavelength of light incident on the optical filter PF, and a Y-axis is a transmittance of light incident on the optical filter PF. In FIG. 11, a transmittance of green light for each wavelength is also indicated. In FIG. 12, an X-axis is an angle of the light incident on the optical filter PF, and a Y-axis is a transmittance of green light incident on the optical filter PF.

Referring to FIGS. 11 and 12 together with FIG. 10, by including the optical filter PF consisting of a plurality of multilayer films having different refractive indices in the opening OP_LS of the light blocking layer LS, a transmittance of green light having an angle of 300 or less may be increased. For example, the reference angle θr of the reference light Lf that determines the fingerprint sensing region LR may be approximately 30°.

FIG. 11 illustrates a transmittance of light incident on each optical filter PF based on a wavelength of about 550 nm, which is a wavelength band of green light. The second light L2, which has a second angle θ2 (e.g., about 40°) greater than the reference angle θr, transmits through the optical filter PF with a transmittance of about 20% or less. The first light L1 (L1_1, L1_2, and L1_3), which has a first angle θ1 (e.g., about 0°, about 10°, and about 20°) smaller than the reference angle θr, transmits through the optical filter PF with a transmittance of about 90% or more.

Referring to FIG. 12, the optical filter PF may transmit about 90% or more of green light having the first angle θ1 of about 0° to about 20°. The optical filter PF may transmit about 20 to about 80% of green light having the reference angle θr of about 20° to about 30°. The optical filter PF may transmit about 10% of green light having the second angle θ2 of about 300 or more. For example, the optical filter PF may reflect about 90% of the second light L2 that is noise light among green light serving as a light source of the photoelectric conversion element PD.

Figure 13:
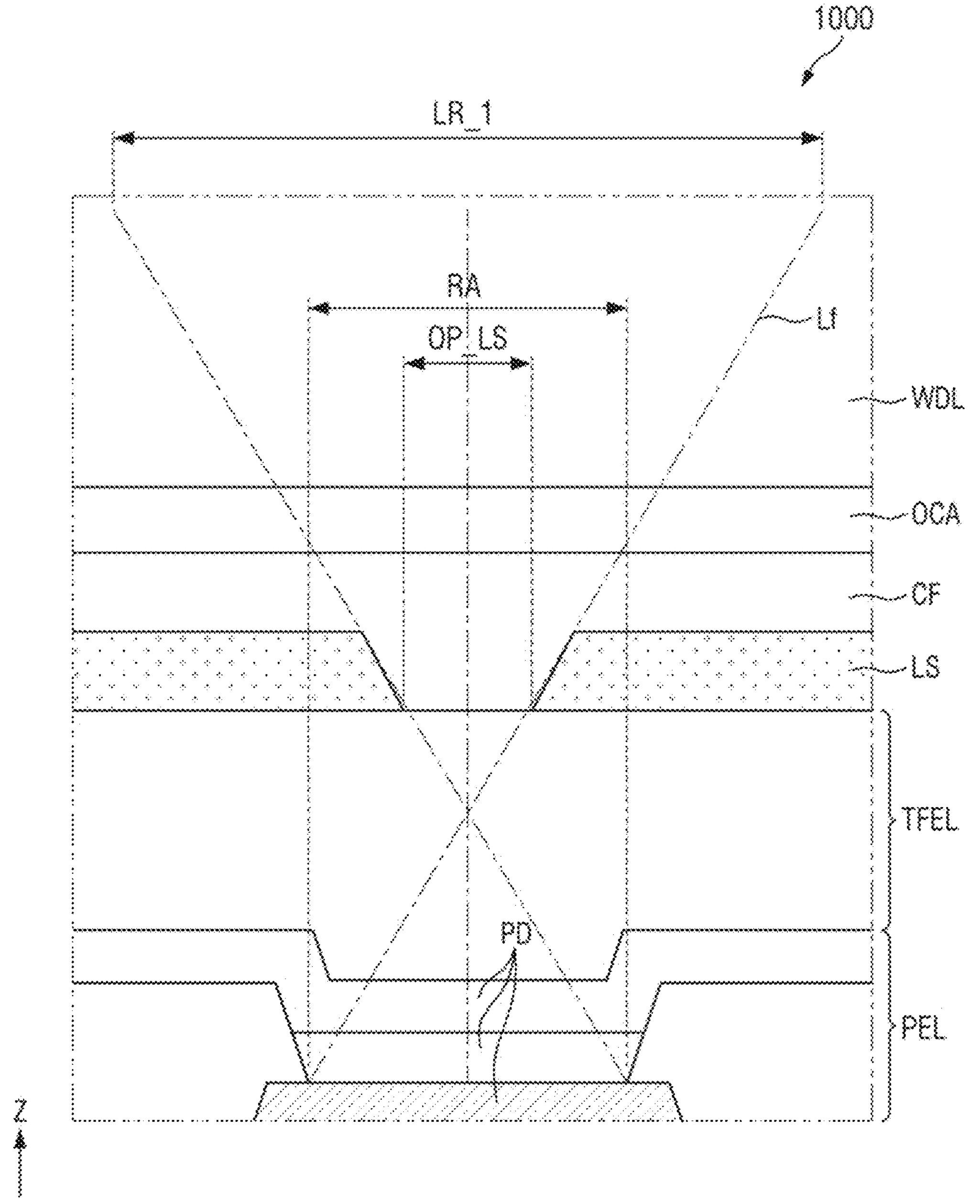
FIG. 13 is an enlarged cross-sectional view of a display device according to a comparative example.
Figure 14:
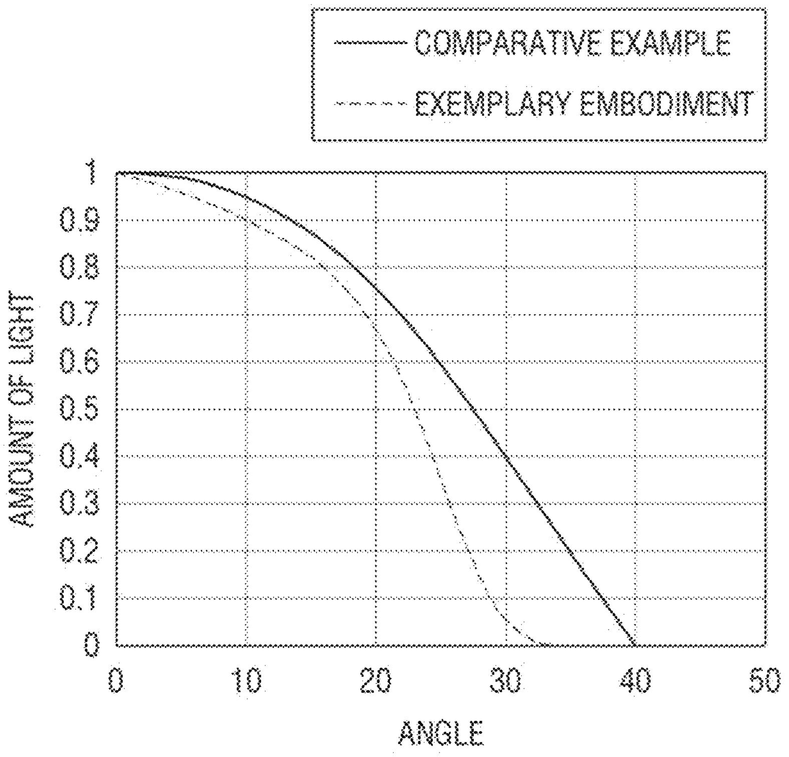
FIG. 14 is a graph comparing a relationship between an incident angle of light and an amount of light in an embodiment of the present invention and a comparative example.

FIG. 13 is an enlarged cross-sectional view of a display device according to a comparative example. FIG. 14 is a graph comparing a relationship between an incident angle of light and an amount of light in an embodiment of the present invention and a comparative example.

In a display device 1000 according to an embodiment of FIG. 13, the light blocking layer LS may include an opening OP_LS having the same width as that of the previous embodiment. The optical filter PF might not be disposed in the opening OP_LS of the light blocking layer LS.

When the optical filter PF is not disposed in the opening OP_LS of the light blocking layer LS, an area of a fingerprint sensing region LR_1 may be greater than an area of the fingerprint sensing region LR of the display device 1_1. For example, the fingerprint sensing region LR_1 may be set by the light sensing unit RA and the opening OP_LS of the light blocking layer LS as illustrated in FIG. 7.

Referring to FIG. 14, in the display device 1_1 according to the present embodiment of the present invention, an amount of light incident on the photoelectric conversion element PD at an angle of about 30° to about 40° may be substantially close to zero. In addition, in the display device 1000 according to the comparative example, an amount of light incident on the photoelectric conversion element PD at an angle of about 300 to about 40° may be approximately 40%.

In other words, in the present embodiment, as the optical filter PF is included, the amount of the second light L2 recognized by the optical sensor PS as a noise signal may be reduced. In addition, as the fingerprint sensing region LR decreases, an accuracy of a fingerprint pattern, which may be sensed by the optical sensor PS, may increase.

Figure 15:
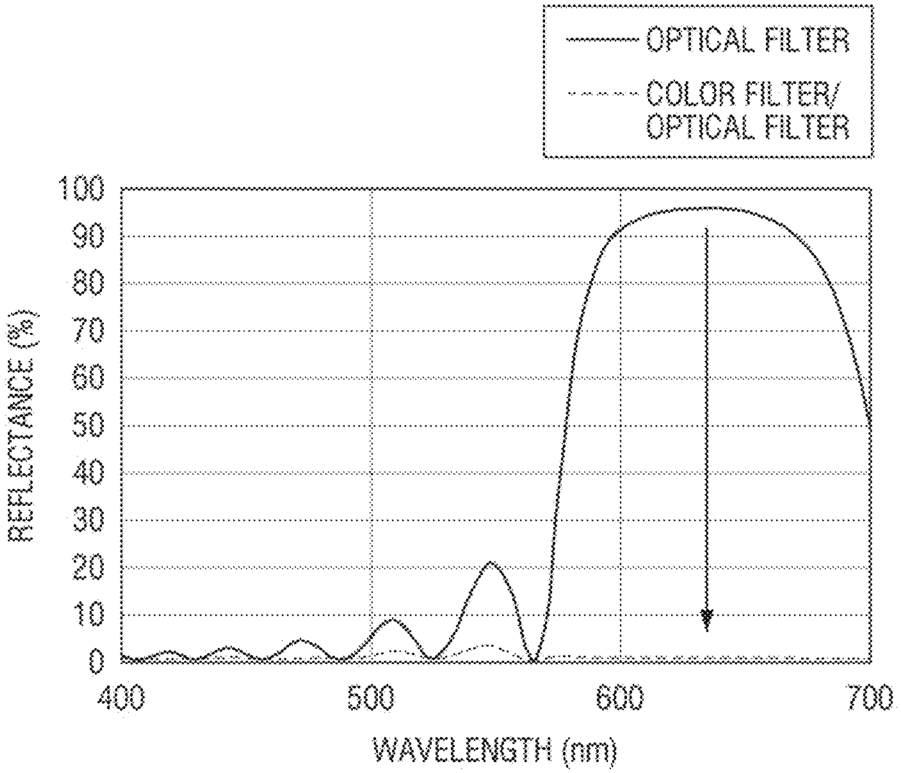
FIG. 15 is a graph illustrating a relationship between a wavelength and a reflectance according to the presence or absence of a color filter.

FIG. 15 is a graph illustrating a relationship between a wavelength and a reflectance according to the presence or absence of a color filter.

As described above, since the optical filter PF transmits the second light and reflects the first light and the third light, the first light and the third light reflected from the optical filter PF may be visually recognized from the outside of the display device 1_1. Therefore, the first light and the third light may be absorbed or blocked by disposing the color filter CF on the light blocking layer LS and the optical filter PF. Accordingly, it is possible to prevent the first light and the third light from being reflected from the upper surface of the optical filter PF and visually recognized from the outside of the display device 1_1.

For example, when the color filter CF is not disposed on the optical filter PF, red light of a wavelength band of about 600 nm to about 750 nm may be reflected with a reflectance of about 90% or more. When the color filter CF is disposed on the optical filter PF, the color filter CF may absorb or block the red light of the wavelength band of about 600 nm to about 750 nm, and thus it is possible to prevent the red light from being visually recognized from the outside.

Hereinafter, a display device according to an embodiment of the present invention will be described.

Figure 16:
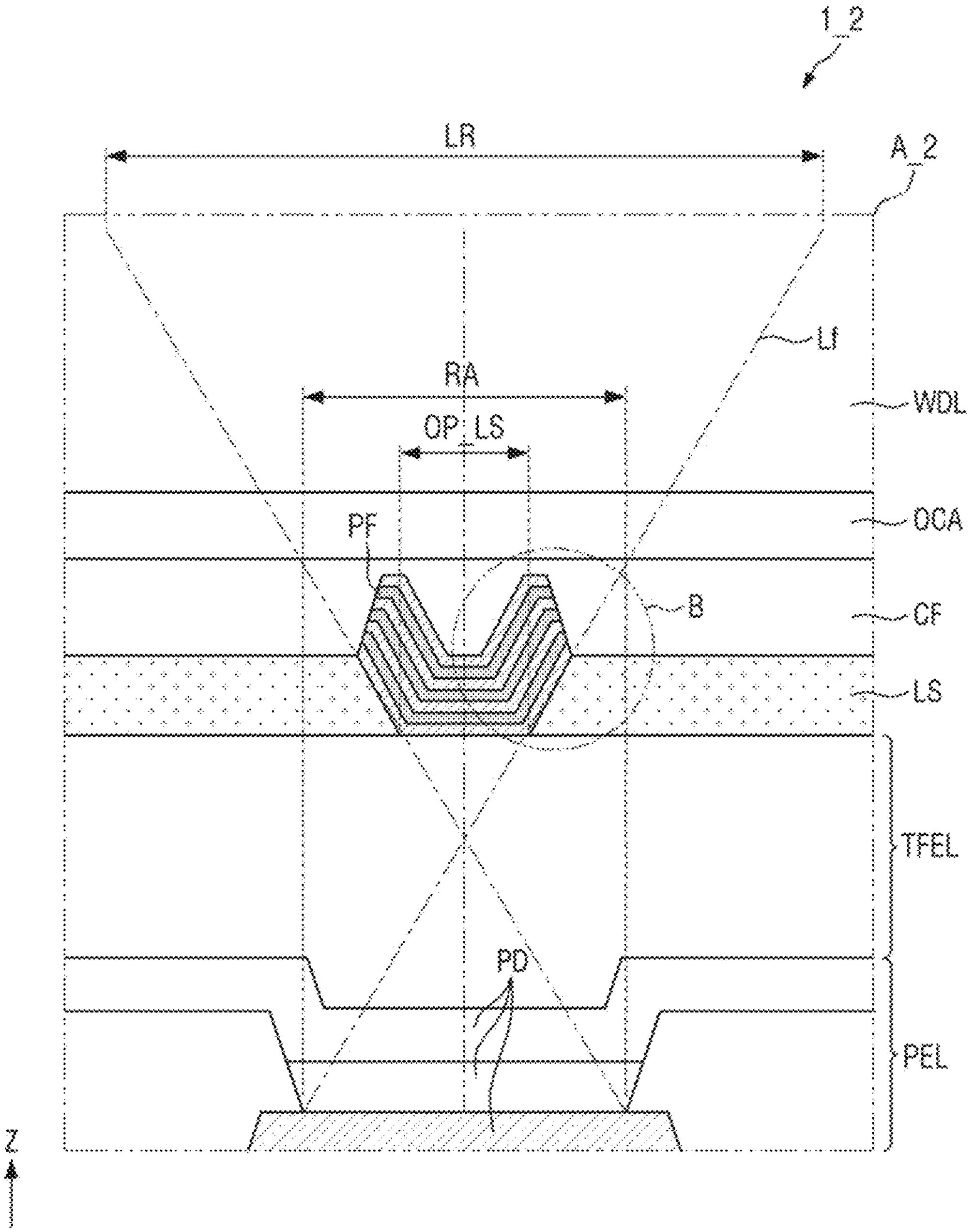
FIG. 16 is an enlarged cross-sectional view of portion A of FIG. 8 according to an embodiment of the present invention.
Figure 17:
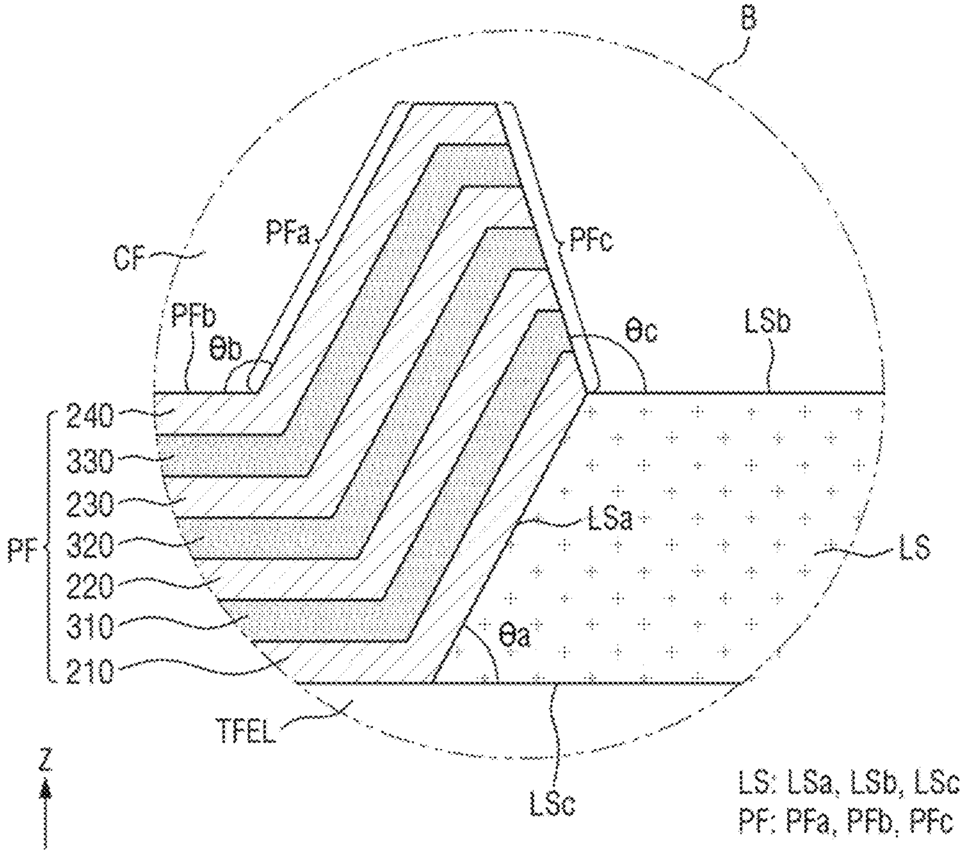
FIG. 17 is an enlarged cross-sectional view of portion B of FIG. 16.

FIG. 16 is an enlarged cross-sectional view of portion A of FIG. 8 according to an embodiment of the present invention. FIG. 17 is an enlarged cross-sectional view of portion B of FIG. 16.

Referring to FIGS. 16 and 17, the present embodiment is different from the previous embodiment in that an optical filter PF of a display device 1_2 includes an inner side surface PFa, an upper surface PFb, and an outer side surface PFc. The inner side surface PFa may connect the upper surface PFb and the outer side surface PFc to each other between the upper surface PFb and the outer side surface PFc. The light blocking layer LS may include a side surface LSa, an upper surface LSb, and a bottom surface LSc.

The inner side surface PFa of the optical filter PF may be a side surface inclined with a predetermined inclination in a direction of the photoelectric conversion element PD. The inner side surface PFa of the optical filter PF may be parallel to the side surface LSa of the light blocking layer LS. The side surface LSa of the light blocking layer LS may be a side surface inclined with a predetermined inclination in a direction of the photoelectric conversion element PD.

A sum of an inclination angle θb of the inner side surface PFa of the optical filter PF with respect to the upper surface PFb and an inclination angle θa of the side surface LSa of the light blocking layer LS with respect to the bottom surface LSc may be 180°. The inclination angle θb of the inner side surface PFa of the optical filter PF is an angle formed between the inner side surface PFa of the optical filter PF and the upper surface PFb of the optical filter PF. The inclination angle θa of the side surface LSa of the light blocking layer LS is an angle formed between the side surface LSa and the bottom surface LSc of the light blocking layer LS.

The outer side surface PFc of the optical filter PF may be a side surface inclined with a predetermined inclination in a direction opposite to the photoelectric conversion element PD. An inclination angle θc of the outer side surface PFc of the optical filter PF may be different from the inclination angle θb of the inner side surface PFa of the optical filter PF. The inclination angle θc of the outer side surface PFc is an angle formed between the outer side surface PFc and the upper surface LSb of the light blocking layer LS. As an example, the inclination angle θb of the inner side surface PFa may be greater than the inclination angle θc of the outer side surface PFc, but present invention is not limited thereto.

The side surface LSa of the light blocking layer LS may be a result of exposing and developing the opening OP_LS of the light blocking layer LS. The inner side surface PFa of the optical filter PF may be a result of depositing the optical filter PF on the side surface LSa of the light blocking layer LS having a substantially constant inclination angle θa. The outer side surface PFc of the optical filter PF may be a result of dry etching the optical filter PF.

The inner side surface PFa and the outer side surface PFc of the optical filter PF may protrude from the upper surface LSb of the light blocking layer LS. The light blocking layer LS may be in contact with an outer side surface among side surfaces of the optical filter PF.

FIGS. 18 to 21 are cross-sectional views for describing a method of manufacturing a display device according to an embodiment of the present invention. In FIGS. 18 to 21, the substrate SUB and the thin film transistor layer TFTL are not illustrated.

Figure 18:
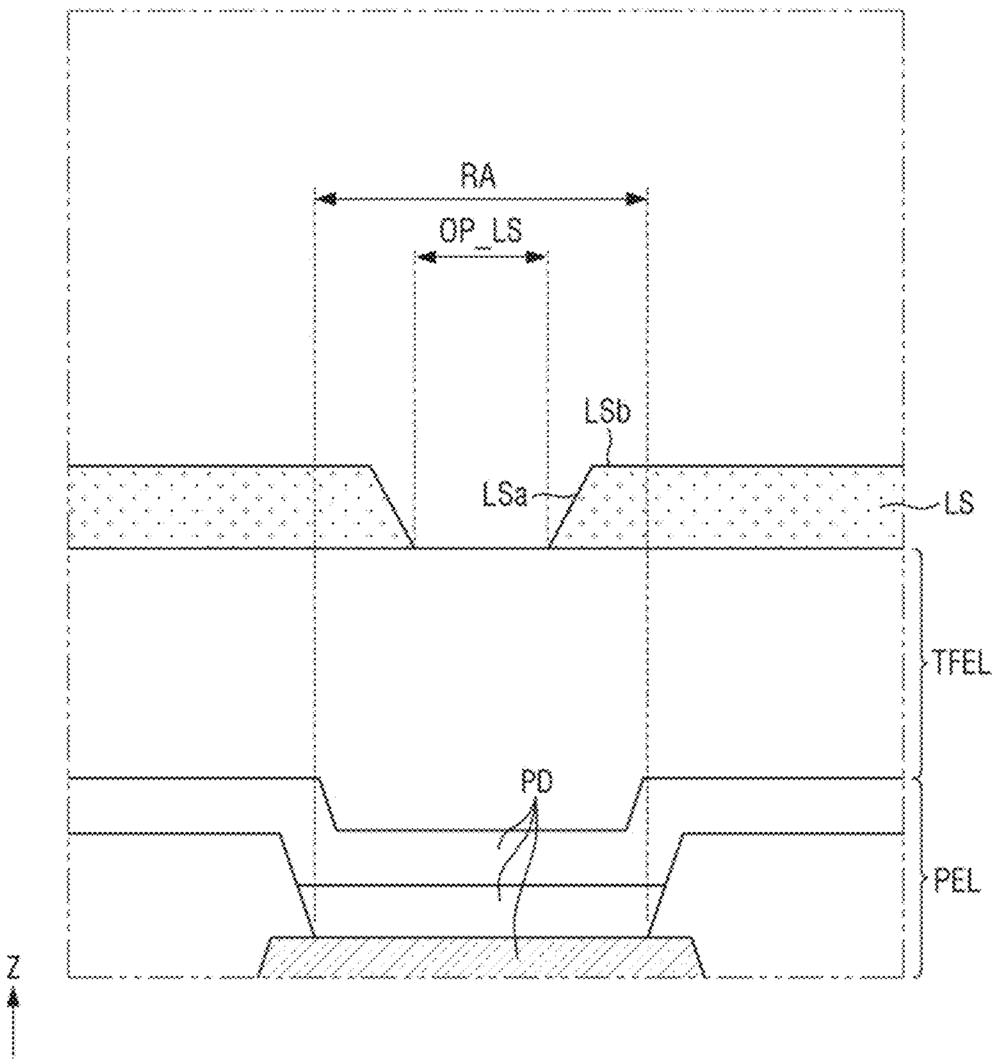
FIGS. 18, 19, 20 and 21 are cross-sectional views for describing a method of manufacturing a display device according to an embodiment of the present invention.

Referring to FIG. 18, a photoelectric element layer PEL including a photoelectric conversion element PD, an encapsulation layer TFEL, and a light blocking layer LS are sequentially formed. Next, an opening OP_LS penetrating through the light blocking layer LS is formed.

The opening OP_LS penetrating through the light blocking layer LS may be formed by forming a light blocking material layer on a surface of the encapsulation layer TFEL, and exposing and developing the light blocking material layer. For example, the light blocking material layer may be formed on an entire surface of the encapsulation layer TFEL. The opening OP_LS may overlap the light sensing unit RA of the photoelectric conversion element PD in the third direction Z. Through the exposure and development process, the side surface LSa of the light blocking layer LS may be inclined in the direction of the photoelectric conversion element PD with a constant inclination angle θa as illustrated in FIG. 17. For example, the side surface LSa may be inclined with respect to an upper surface of the encapsulation layer TFEL.

Figure 19:
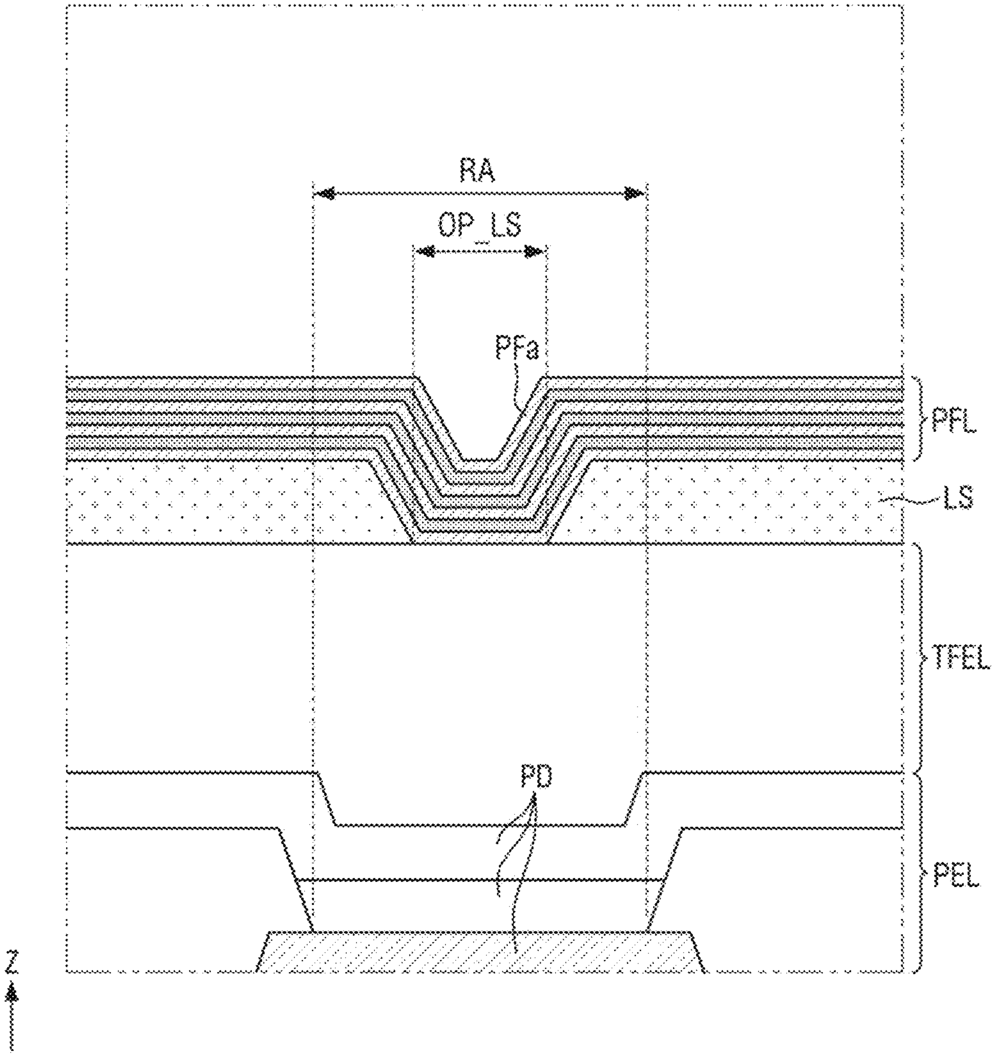

Referring to FIG. 19, an optical filter material layer PFL is deposited on the light blocking layer LS. The optical filter material layer PFL may correspond to the optical filter PF. A plurality of low refractive material layers and a plurality of high refractive material layers disposed in the optical filter material layer PFL may correspond to the low refractive layers 210, 220, 230, and 240 and the high refractive layers 310, 320, and 330 of the optical filter PF. That is, the material layers may include the same material as the optical filter PF.

The optical filter material layer PFL may be deposited on the upper surface LSb and the side surface LSa of the light blocking layer LS. Accordingly, an inner side surface PFa of the optical filter material layer PFL may be inclined with a predetermined inclination in the direction of the photoelectric conversion element PD. The inner side surface PFa of the optical filter material layer PFL may have a predetermined inclination angle corresponding to the inclination angle of the side surface LSa of the light blocking layer LS. For example, the inner side surface PFa of the optical filter material layer PFL may be parallel to the side surface LSa of the light blocking layer LS.

Figure 20:
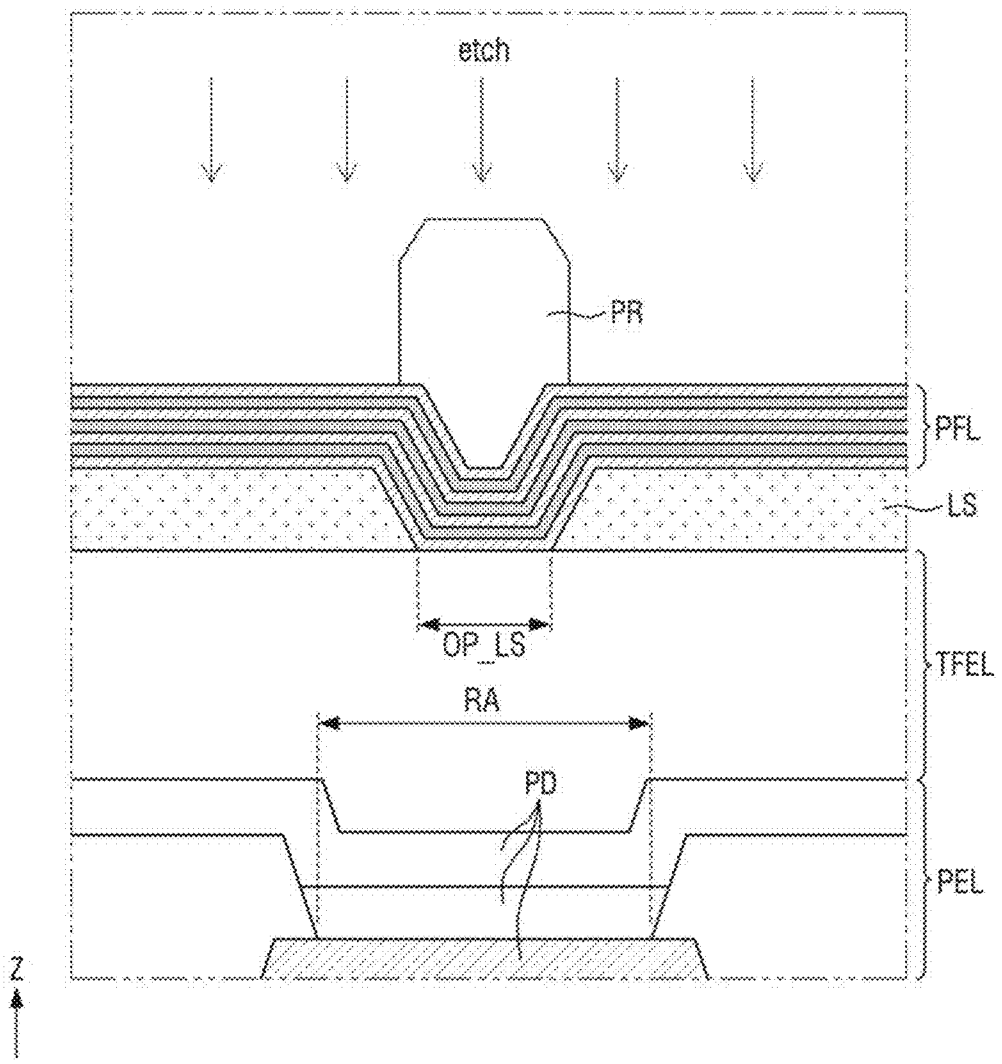

Referring to FIG. 20, a photoresist pattern PR is formed on the optical filter material layer PFL. Although not limited thereto, the photoresist pattern PR may be a mask pattern that etches the optical filter material layer PFL to expose the upper surface LSb of the light blocking layer LS.

Figure 21:
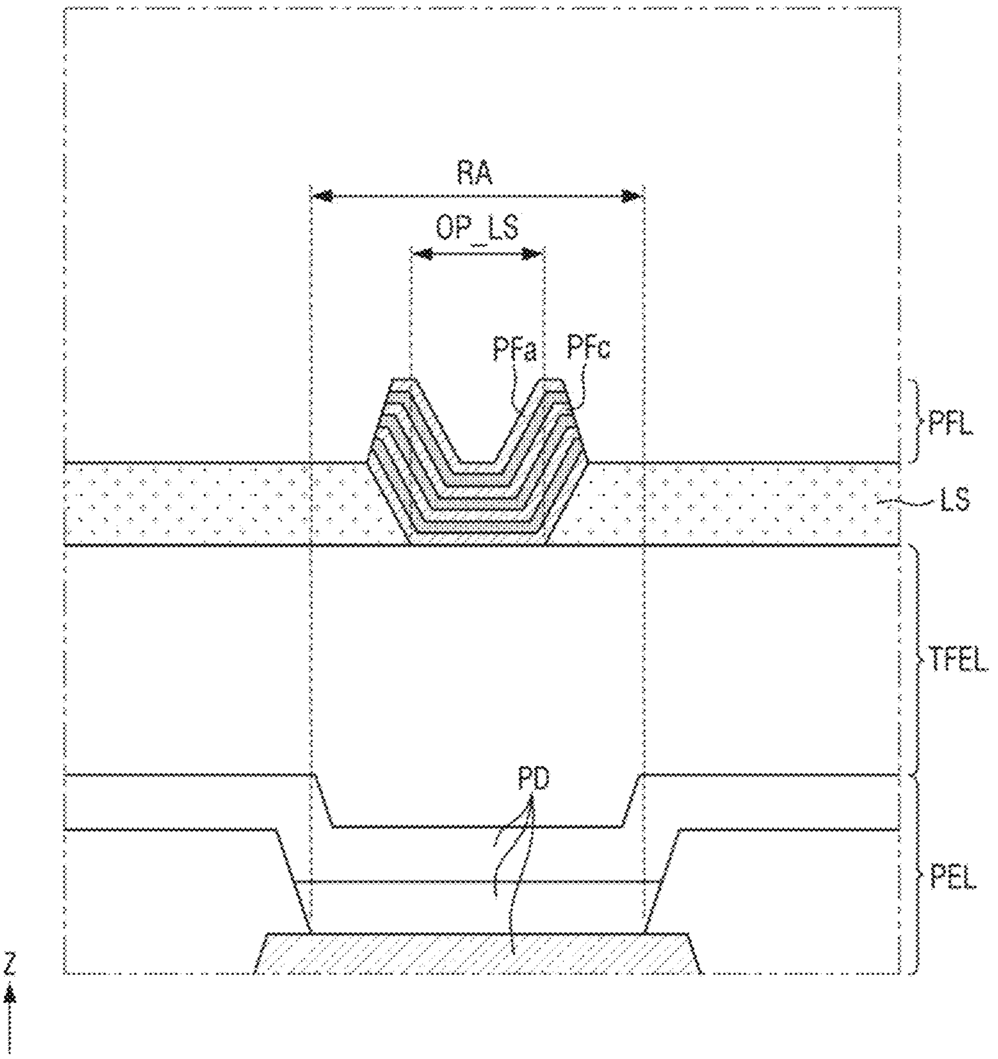

Next, referring to FIG. 21, an etching process of etching an exposed optical filter material layer PFL on which the photoresist pattern PR is not disposed is performed, and the photoresist pattern PR is removed. The etching process may be, for example, a dry etching method, a wet etching method, a reactive ion etching (RIE) method, an inductively coupled plasma reactive ion etching (ICP-RIE) method, or the like. Since anisotropic etching is possible in the dry etching method, the dry etching method may be suitable for vertical etching.

The optical filter PF may be formed by etching the optical filter material layer PFL according to the etching process. According to an etching process, the optical filter PF may include an outer side surface PFc inclined in a direction opposite to the photoelectric conversion element PD. An inclination angle θc of the outer side surface PFc may vary depending on the degree of etching.

Although not limited thereto, since the etching process may expose the upper surface LSb of the light blocking layer LS, the optical filter PF might not be in contact with the upper surface LSb of the light blocking layer LS. For example, the entire upper surface LSb of the light blocking layer LS may be exposed as a result of the etching process. In this case, reflection of external light by the optical filter PF may be prevented.

Thereafter, a display device 1_2 as illustrated in FIG. 16 may be formed by forming a color filter CF, a transparent adhesive member OCA, and a window WDL on the optical filter PF and the light blocking layer LS.

According to the present embodiment of the present invention, the fingerprint sensing region LR may be narrowed without reducing the opening OP_LS of the light blocking layer LS by disposing the optical filter PF in the opening OP_LS of the light blocking layer LS. Accordingly, the accuracy of fingerprint recognition of the display device 1_2 may be increased.

Hereinafter, a display device 1_3 according to an embodiment of the present invention will be described with reference to FIGS. 22 to 27.

Figure 22:
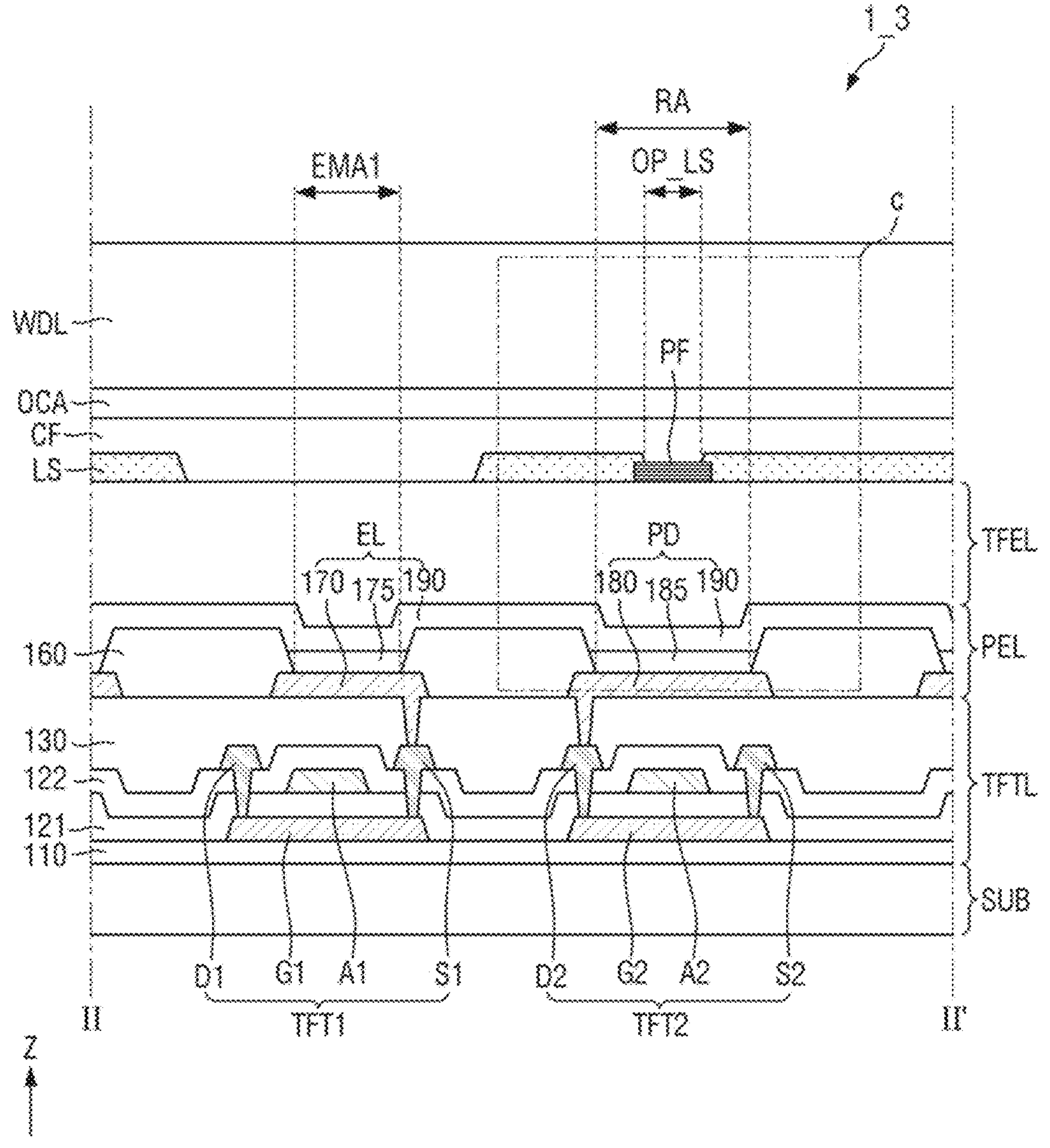
FIG. 22 is a cross-sectional view of a display device according to an embodiment of the present invention.
Figure 23:
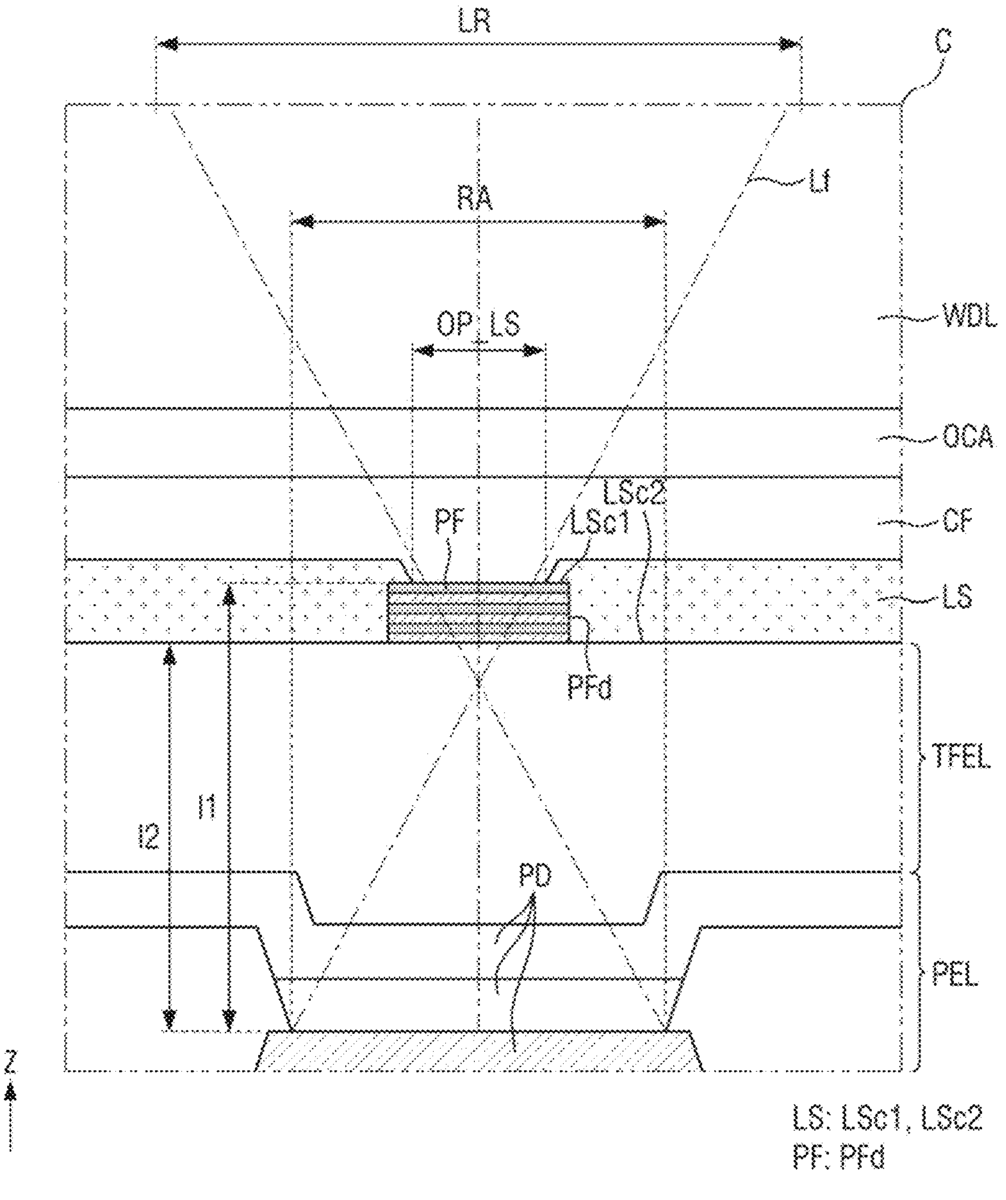
FIG. 23 is an enlarged cross-sectional view of portion C of FIG. 22.

FIG. 22 is a cross-sectional view of a display device according to an embodiment of the present invention. FIG. 23 is an enlarged cross-sectional view of portion C of FIG. 22.

The present embodiment of the present invention is the same as the previous embodiments in that the opening OP_LS of the light blocking layer LS overlaps the photoelectric conversion element PD and the optical filter PF in the third direction Z.

In addition, the light blocking layer LS may be in contact with the side surface PFd of the optical filter PF. For example, the light blocking layer LS may completely contact the side surface PFd of the optical filter PF. The light blocking layer LS includes a first bottom surface LSc1 and a second bottom surface LSc2. The first bottom surface LSC1 may be disposed on the optical filter PF, and the second bottom surface LSc2 may be disposed on the encapsulation layer TFEL. The first bottom surface LSc1 of the light blocking layer LS may be in contact with the upper surface of the optical filter PF, and the second bottom surface LSc2 thereof may be in contact with the upper surface of the encapsulation layer TFEL. However, the present invention is not limited thereto, and when an inorganic film or an organic film is disposed between the light blocking layer LS and the encapsulation layer TFEL, the second bottom surface LSc2 of the light blocking layer LS may be in contact with an upper surface of the inorganic film or the organic film.

The side surface PFd of the optical filter PF may be a side surface inclined with a predetermined inclination or a side surface perpendicular to the substrate SUB. The side surface PFd of the optical filter PF may be a result of dry etching.

A width of the opening OP_LS of the light blocking layer LS in one direction may be smaller than a width of the optical filter PF in one direction. This is different from the previous embodiments of the present invention in which as the optical filter PF is disposed in the opening OP_LS, the width of the optical filter PF in one direction is the same as the width of the opening OP_LS in one direction.

In addition, as described with reference to FIG. 7, the fingerprint sensing region LR_1 may decrease as the distance 1 between the light blocking layer LS and the light sensor PS increases. In the present embodiment, a first distance 11 between the first bottom surface LSc1 of the light blocking layer LS and the light sensing unit RA may be greater than a second distance 12 between the second bottom surface LSc2 and the light sensing unit RA. Since the first distance 11 between the first bottom surface LSc1 of the light blocking layer LS and the light sensing unit RA is a factor that determines the area of the fingerprint sensing region LR, the fingerprint sensing region LR may be reduced.

FIGS. 24 to 27 are cross-sectional views for describing a method of manufacturing a display device according to an embodiment of the present invention.

Figure 24:
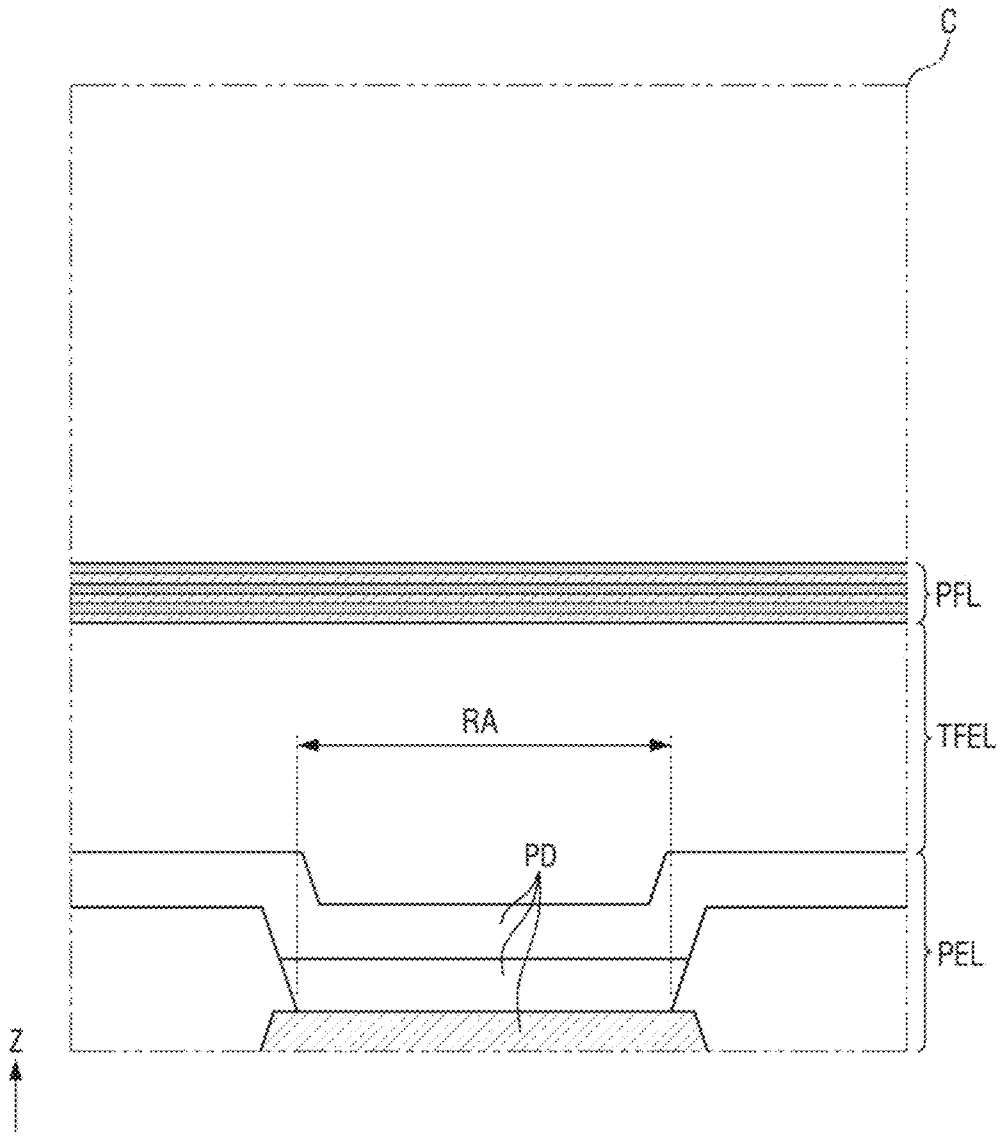
FIGS. 24, 25, 26 and 27 are cross-sectional views for describing a method of manufacturing a display device according to an embodiment of the present invention.

Referring to FIG. 24, an optical filter material layer PFL is deposited on the encapsulation layer TFEL. The optical filter material layer PFL may correspond to the optical filter PF. A plurality of low refractive material layers and a plurality of high refractive material layers disposed in the optical filter material layer PFL may correspond to the low refractive layers 210, 220, 230, and 240 and the high refractive layers 310, 320, and 330 of the optical filter PF. That is, the material layers may include the same material as the optical filter PF.

Unlike the previous embodiment in which the optical filter material layer PFL has the inner side surface inclined to fit the opening of the light blocking layer, the bottom and upper surfaces of the optical filter material layer PFL may be substantially flat.

Figure 25:
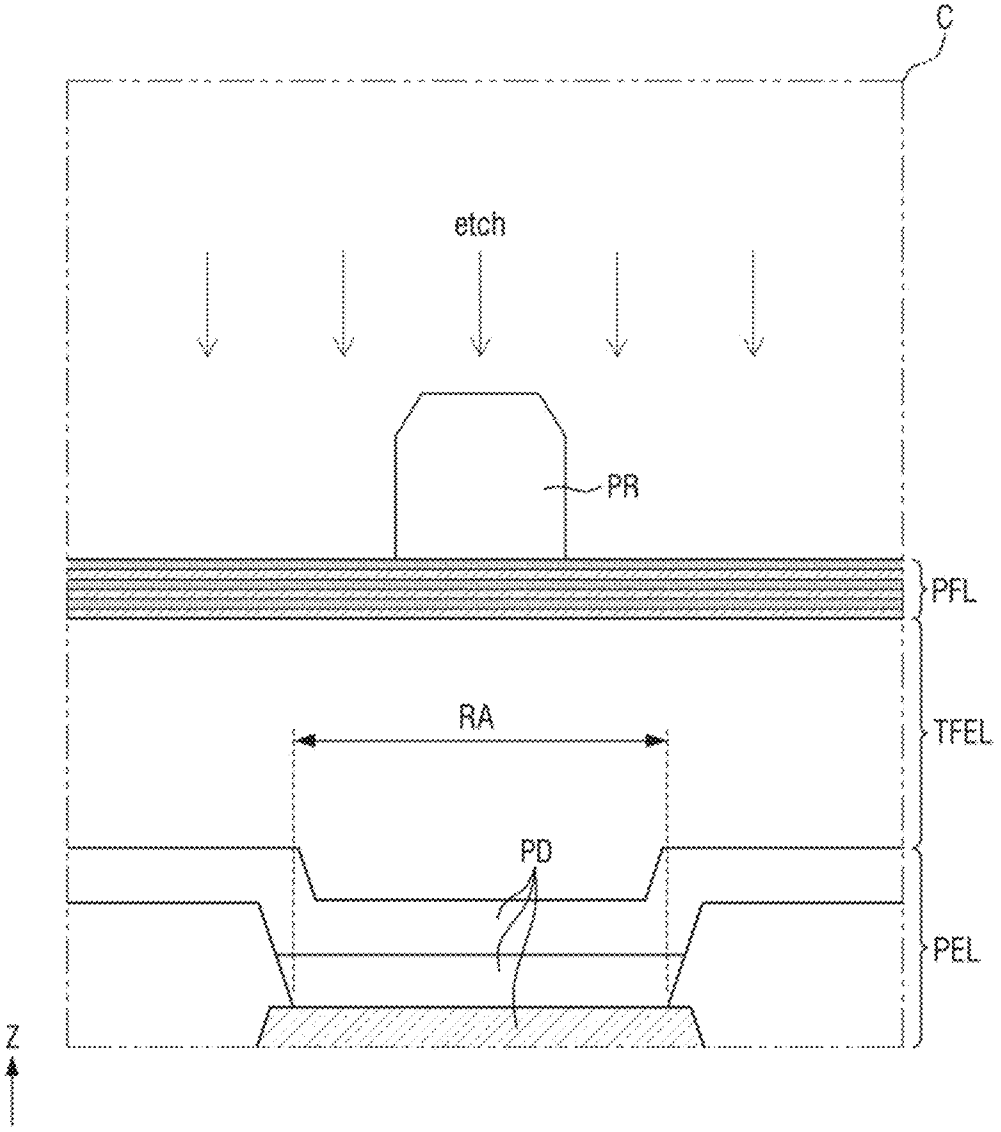

Next, referring to FIG. 25, a photoresist pattern PR is formed on the optical filter material layer PFL. The photoresist pattern PR may be a mask pattern that etches the optical filter material layer PFL. Since the photoresist pattern PR overlaps the photoelectric conversion element PD in the third direction Z, the optical filter material layer PFL disposed in a region other than the region overlapping the photoelectric conversion element PD may be removed.

Figure 26:
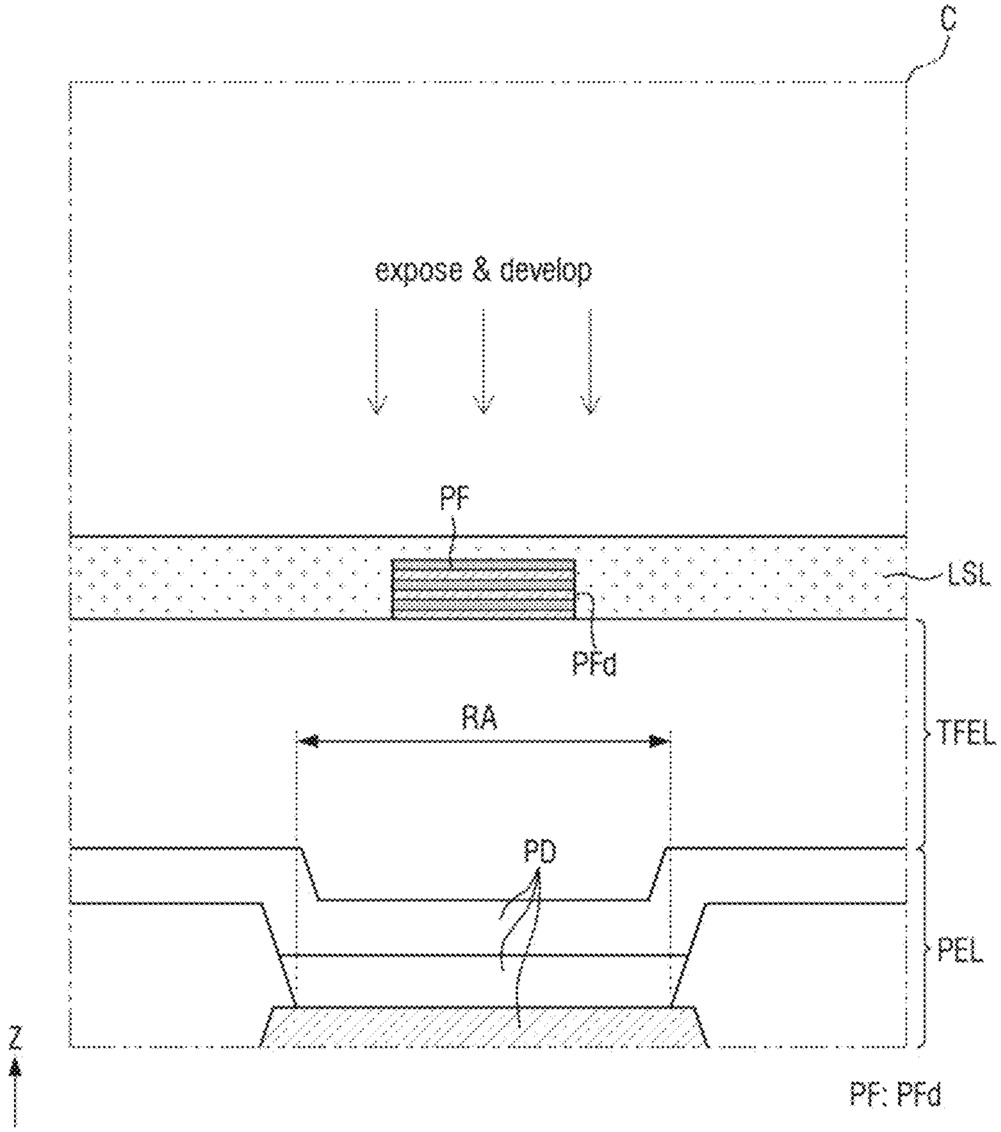

Referring to FIG. 26, an etching process of etching an exposed optical filter material layer PFL on which the photoresist pattern PR is not disposed is performed, and the photoresist pattern PR is removed. The etching process may be, for example, a dry etching method, a wet etching method, a reactive ion etching (RIE) method, an inductively coupled plasma reactive ion etching (ICP-RIE) method, or the like. Since anisotropic etching is possible in the dry etching method, the dry etching method may be suitable for vertical etching.

The optical filter PF may be formed by etching the optical filter material layer PFL according to the etching process. The optical filter PF may have a side surface PFd that is inclined or perpendicular to the upper surface of the substrate SUB according to the degree of dry etching.

Next, a light blocking material layer LSL completely covering the side surface PFd and the upper surface of the optical filter PF may be formed. The light blocking material layer LSL may include the same material as the light blocking layer LS, for example, an organic light blocking material.

Figure 27:
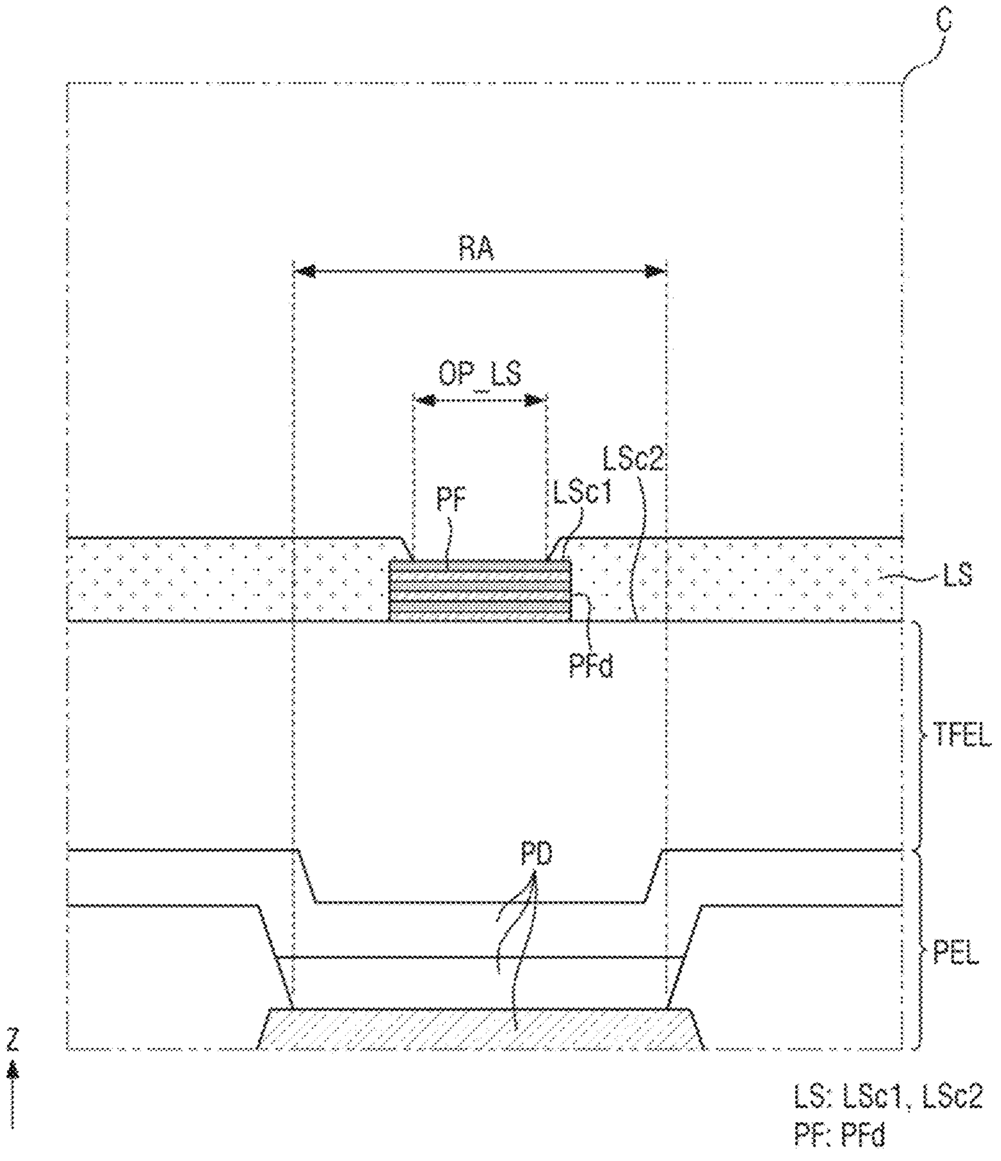

Referring to FIG. 27, an opening OP_LS penetrating through the light blocking layer LS may be formed by exposing and developing the light blocking material layer LSL. The opening OP_LS may overlap the light sensing unit RA of the photoelectric conversion element PD in the third direction Z. The opening OP_LS may overlap the optical filter PF. A width of the opening OP_LS in one direction may be smaller than a width of the optical filter PF in one direction.

In addition, the light blocking layer LS includes a first bottom surface LSc1 and a second bottom surface LSc2. The first bottom surface LSc1 may be disposed on the optical filter PF, and the second bottom surface LSc2 may be disposed on the encapsulation layer TFEL.

Thereafter, a display device 1_3 as illustrated in FIG. 22 may be formed by forming a color filter CF, a transparent adhesive member OCA, and a window WDL on the optical filter PF and the light blocking layer LS.

According to the present embodiment, the fingerprint sensing region LR may be narrowed without reducing the opening OP_LS of the light blocking layer LS by disposing the optical filter PF overlapping the opening OP_LS of the light blocking layer LS. Accordingly, the accuracy of fingerprint recognition of the display device 1_3 may be increased.

While the present invention has been described with reference to the embodiments thereof, it will be understood by those of ordinary skill in the art that various changes in form and detail may be made thereto without departing from the spirit and scope of the present invention.

What is claimed is:

1. A display device comprising:

a substrate;

a light emitting element disposed on the substrate and configured to emit light in a light emitting unit;

a photoelectric conversion element disposed on the substrate and configured to sense incident light;

a light blocking layer disposed on the photoelectric conversion element and having an opening, the light blocking layer is disposed farther from the substrate than the light emitting element is disposed from the substrate; and an optical filter disposed in the opening of the light blocking layer to transmit incident light, wherein the optical filter substantially eliminates light incident on the photoelectric conversion element at an angle of about 30° to about 40°, and wherein an entirety of the light blocking layer does not overlap the light emitting unit in a thickness direction of the substrate.

2. The display device of claim 1, wherein the optical filter includes a low refractive layer and a high refractive layer having a higher refractive index than that of the low refractive layer.

3. The display device of claim 2, wherein the low refractive layer and the high refractive layer are provided in plurality, respectively, and the high refractive layers and the low refractive layers are alternately disposed on each other in the thickness direction of the substrate.

4. The display device of claim 2, further comprising a window disposed on the optical filter, wherein a refractive index of the window is lower than the refractive index of the high refractive layer.

5. The display device of claim 1, wherein the optical filter includes at least one SiO2, TiO2, ZrO2, Ta2O5, HfO2, Al2O3, ZnO, Y2O3, BeO, MgO, PbO2, WO3, VOX, SiNX, eNX, AlN, ZnS, CdS, SiC, SiCN, MgF, CaF2, NaF, BaF2, PbF2, LiF, LaF3, GaP, or AlOx.

6. The display device of claim 1, wherein the photoelectric conversion element is configured to sense light of a green wavelength band, and the optical filter is configured to transmit the light of the green wavelength band.

7. The display device of claim 1, wherein the optical filter is configured to reflect light of a red wavelength band.

8. The display device of claim 1, further comprising a color filter disposed on the optical filter and the light blocking layer.

9. The display device of claim 8, wherein the color filter is configured to transmit light of a green wavelength band.

10. The display device of claim 1, wherein the opening of the light blocking layer overlaps the photoelectric conversion element in the thickness direction of the substrate, and a width of the opening of the light blocking layer in one direction is smaller than a width of the photoelectric conversion element in the one direction.

11. The display device of claim 1, wherein a thickness of the optical filter is greater than a thickness of the light blocking layer.

12. The display device of claim 1, wherein a thickness of the optical filter is smaller than a thickness of the light blocking layer.

13. The display device of claim 1, wherein the optical filter includes:

an inner side surface inclined in a direction toward the photoelectric conversion element, and an outer side surface inclined in a direction away from the photoelectric conversion element.

14. The display device of claim 13, wherein the light blocking layer includes a side surface inclined in the direction toward the photoelectric conversion element, and a sum of an inclination angle of the inner side surface of the optical filter and an inclination angle of the side surface of the light blocking layer is 180°.

15. The display device of claim 13, wherein an inclination angle of the inner side surface of the optical filter with respect to an upper surface of the substrate is different from an inclination angle of the outer side surface of the optical filter with respect to an upper surface of the substrate.

16. The display device of claim 13, wherein the inner side surface and the outer side surface of the optical filter protrude beyond an upper surface of the light blocking layer.

17. An electronic device comprising:

a display device comprising:

a substrate;

a light emitting element disposed on the substrate and configured to emit light in a light emitting unit;

a photoelectric conversion element disposed on the substrate and configured to sense incident light;

an encapsulation layer disposed on the light emitting element and the photoelectric conversion element;

a light blocking layer disposed on the encapsulation layer and including an opening, the light blocking layer is disposed farther from the substrate than the light emitting element is disposed from the substrate; and an optical filter overlapping the photoelectric conversion element in a thickness direction of the substrate and having a multilayer film, wherein the optical filter substantially eliminates light incident on the photoelectric conversion element at an angle of about 30° to about 40°, and wherein an entirety of the light blocking layer does not overlap the light emitting unit in the thickness direction of the substrate.

18. The electronic device of claim 17, wherein the light blocking layer is in contact with a side surface of the optical filter.

19. The electronic device of claim 17, wherein the light blocking layer includes a first bottom surface and second bottom surface, wherein the first bottom surface is disposed on the encapsulation layer, and the second bottom surface is disposed on the optical filter, and a distance between the photoelectric conversion element and the first bottom surface is shorter than a distance between the photoelectric conversion element and the second bottom surface.

20. The electronic device of claim 17, wherein a width of the opening in one direction is smaller than a width of the optical filter in the one direction.

* * * * *